United States Patent
Makino

(10) Patent No.: US 10,766,073 B2
(45) Date of Patent: Sep. 8, 2020

(54) COMPONENT MOUNTING APPARATUS AND COMPONENT MOUNTING METHOD

(71) Applicant: Panasonic Intellectual Property Management Co., Ltd., Osaka (JP)

(72) Inventor: Yoichi Makino, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 336 days.

(21) Appl. No.: 15/695,324

(22) Filed: Sep. 5, 2017

(65) Prior Publication Data
US 2018/0093328 A1   Apr. 5, 2018

(30) Foreign Application Priority Data

Sep. 30, 2016   (JP) .................................. 2016-192822

(51) Int. Cl.
| | |
|---|---|
| *H05K 3/30* | (2006.01) |
| *B23B 3/32* | (2006.01) |
| *B23P 21/00* | (2006.01) |
| *B23P 19/04* | (2006.01) |
| *B23B 9/00* | (2006.01) |

(Continued)

(52) U.S. Cl.
CPC ................ *B23B 3/32* (2013.01); *B23P 19/04* (2013.01); *B23P 21/00* (2013.01); *B23B 9/005* (2013.01); *B23B 13/121* (2013.01); *H05K 1/0284* (2013.01); *H05K 13/0015* (2013.01); *H05K 13/04* (2013.01); *H05K 2203/1554* (2013.01); *H05K 2203/167* (2013.01); *Y10T 29/4913* (2015.01)

(58) Field of Classification Search
CPC ......... Y10T 29/53178; Y10T 29/53174; Y10T 29/49131; Y10T 29/49133; Y10T 29/53091; Y10T 29/53261; Y10T 29/4913; Y10T 29/49826; H05K 13/04; H05K 13/0413; H05K 2203/1554
USPC .................. 29/832, 739, 740, 743, 833, 834
See application file for complete search history.

(56) References Cited

U.S. PATENT DOCUMENTS

| | | | |
|---|---|---|---|
| 6,519,837 B1 | 2/2003 | Ichikawa et al. | |
| 6,941,646 B2 * | 9/2005 | Suhara | H05K 13/0069 29/740 |

(Continued)

FOREIGN PATENT DOCUMENTS

| | | |
|---|---|---|
| JP | H09-237995 A | 9/1997 |
| JP | 2000-022395 A | 1/2000 |

(Continued)

OTHER PUBLICATIONS

Chinese Search Report dated Jun. 3, 2020 for the related Chinese Patent Application No. 201710858444.2.

*Primary Examiner* — Thiem D Phan
(74) *Attorney, Agent, or Firm* — Pearne & Gordon LLP

(57) ABSTRACT

After a chuck portion chucks a workpiece holding body which aligns and holds a plurality of workpieces on which components are to be placed, the posture of the workpieces held in the workpiece holding body is adjusted due to rotation mechanism by rotating the chuck portion around an axial line which extends in an aligning direction of the plurality of workpieces held in the workpiece holding body. Then, a placing head places the components on each of the plurality of workpieces which are subjected to posture adjustment.

8 Claims, 18 Drawing Sheets

(51) Int. Cl.
*B23B 13/12* (2006.01)
*H05K 1/02* (2006.01)
*H05K 13/00* (2006.01)
*H05K 13/04* (2006.01)

(56) References Cited

U.S. PATENT DOCUMENTS

| | | | |
|---|---|---|---|
| 8,001,678 B2 * | 8/2011 | Kabeshita | H01L 21/67132 |
| | | | 29/739 |
| 2001/0054223 A1 | 12/2001 | Yamanashi et al. | |
| 2004/0056400 A1 | 3/2004 | Ghuman et al. | |
| 2007/0169331 A1 | 7/2007 | Yoshida et al. | |
| 2008/0188363 A1 | 8/2008 | Baumbusch et al. | |
| 2011/0000082 A1 | 1/2011 | Yamashita et al. | |
| 2012/0285628 A1 | 11/2012 | Katsumi et al. | |
| 2013/0283594 A1 | 10/2013 | Iwaki et al. | |
| 2017/0196131 A1 | 7/2017 | Ishikawa | |

FOREIGN PATENT DOCUMENTS

| | | |
|---|---|---|
| JP | 2002-076028 A | 3/2002 |
| JP | 2010-263069 A | 11/2010 |
| JP | 2011-138834 A | 7/2011 |
| JP | 2012-119643 A | 6/2012 |
| JP | 2012-178489 A | 9/2012 |
| JP | 5779342 B2 | 9/2015 |
| WO | 2015/186188 A1 | 12/2015 |

* cited by examiner

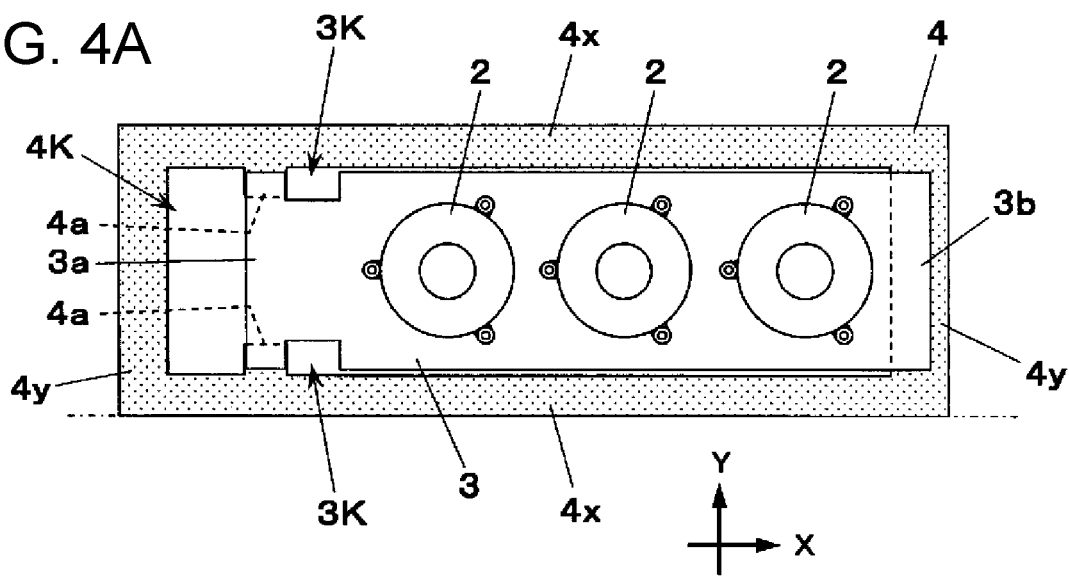
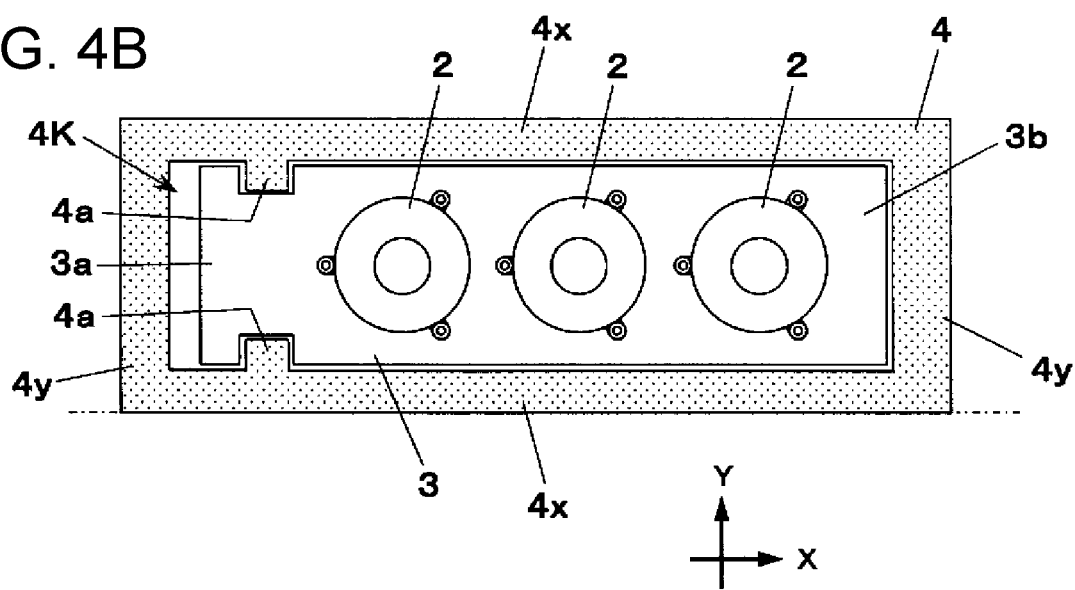

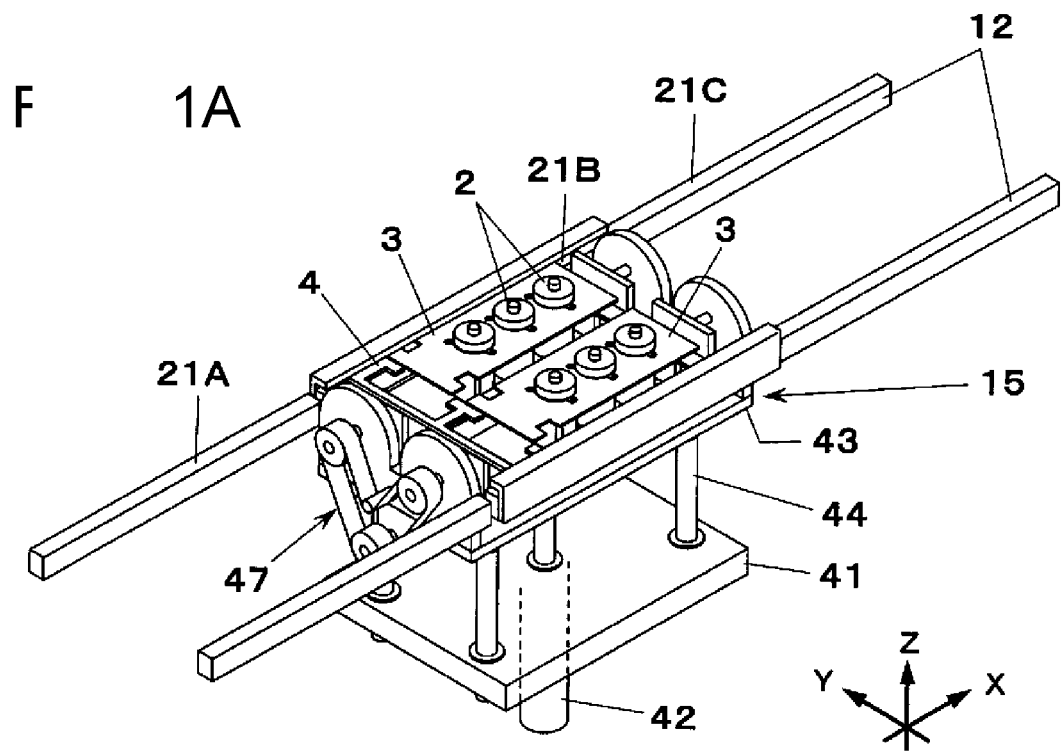
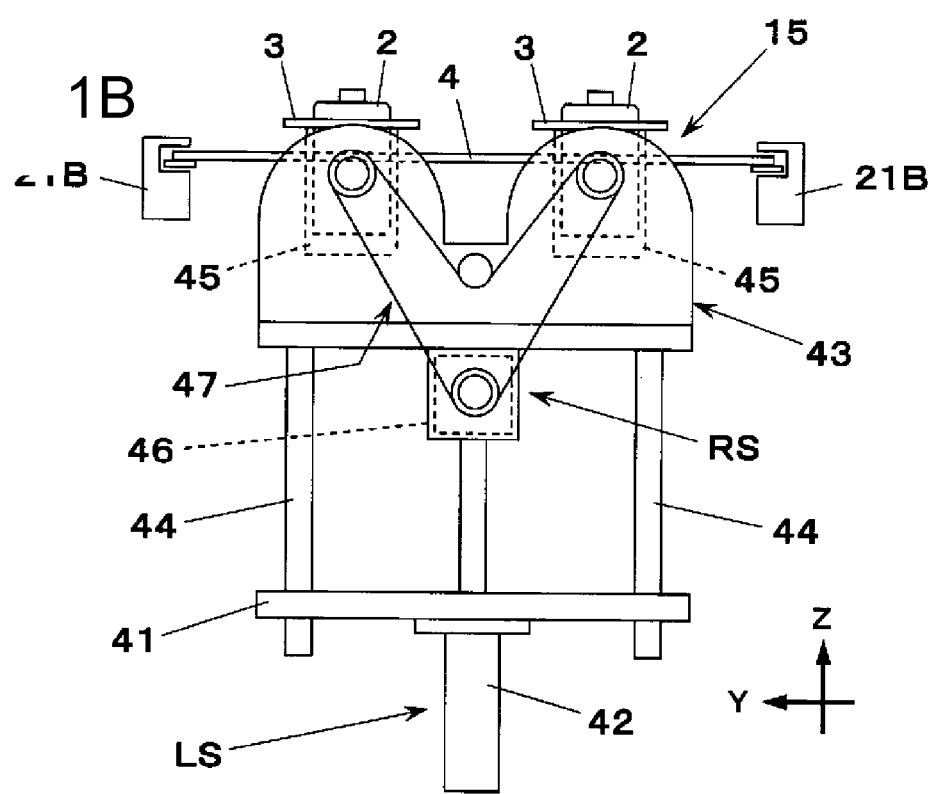

COMPONENT MOUNTING APPARATUS AND COMPONENT MOUNTING METHOD

BACKGROUND

1. Technical Field

The present disclosure relates to a component mounter which places components on a workpiece.

2. Description of the Related Art

In the related art, a three-dimensionally shaped board which is referred to as a three-dimensional board or the like is known, and a component mounter which places components on a workpiece using such a three-dimensionally shaped board as the workpiece is known (for example, PTL 1 described below). In such a component mounter, the posture of the workpiece is freely changed by a posture adjustment mechanism so that the surface of the component mounting part which is set on the workpiece is caused to face upward, and then the component is placed on the component placing part by a placing head.

CITATION LIST

Patent Literature

PTL 1; Japanese Patent No. 5779342

SUMMARY

A component mounter of the disclosure includes a workpiece holding body which aligns and holds a plurality of workpieces on which components are to be placed; a chuck portion which chucks the workpiece holding body holding the plurality of workpieces; a rotation mechanism which adjusts postures of the plurality of workpieces held in the workpiece holding body, by rotating the chuck portion which chucks the workpiece holding body, around an axial line which extends in an aligning direction of the plurality of workpieces held in the workpiece holding body; and a placing head which places the components on each of the plurality of workpieces which are subjected to posture adjustment by the rotation mechanism.

A component mounting method of the disclosure for a component mounter including: a workpiece holding body which aligns and holds a plurality of workpieces on which components are to be placed; a chuck portion which chucks the workpiece holding body; a rotation mechanism which rotates the chuck portion; and a placing head which places the components on each of the plurality of workpieces, the method includes chucking the workpiece holding body adjusting postures of the plurality of workpieces, by rotating the chuck portion, around an axial line which extends in an aligning direction of the plurality of workpieces; and placing the components on each of the plurality of workpiece.

According to the disclosure, it is possible to collectively perform the posture adjustment of a plurality of workpieces with inexpensive configuration, and it is possible to improve productivity.

BRIEF DESCRIPTION OF THE DRAWINGS

FIGS. 4A and 4B are plan views illustrating the workpiece holding body with which the component mounter is provided together with the carrier in an exemplary embodiment of the disclosure;

FIGS. 11A and 11B are respectively a perspective diagram and a side surface diagram illustrating the posture adjustment mechanism with which the component mounter is provided together with a transport conveyor in an exemplary embodiment of the disclosure;

DETAILED DESCRIPTION

Before an exemplary embodiment of the disclosure is described, a problem in the related art is briefly described. In the above-mentioned component mounter in the related art, the mechanism for adjusting the posture of the workpiece (the posture adjustment mechanism) is for one workpiece, and then all of the surfaces of the workpiece can be turned upward. In a case where the posture adjustment for a plurality of workpieces is carried out collectively, the configuration of the posture adjustment mechanism becomes complicated extremely, and then manufacturing cost may be increased.

Therefore, an object of the disclosure is to provide a component mounter and a component mounting method capable of collectively performing the posture adjustment of a plurality of workpieces with inexpensive configuration, and capable of improving productivity.

Figure 1:
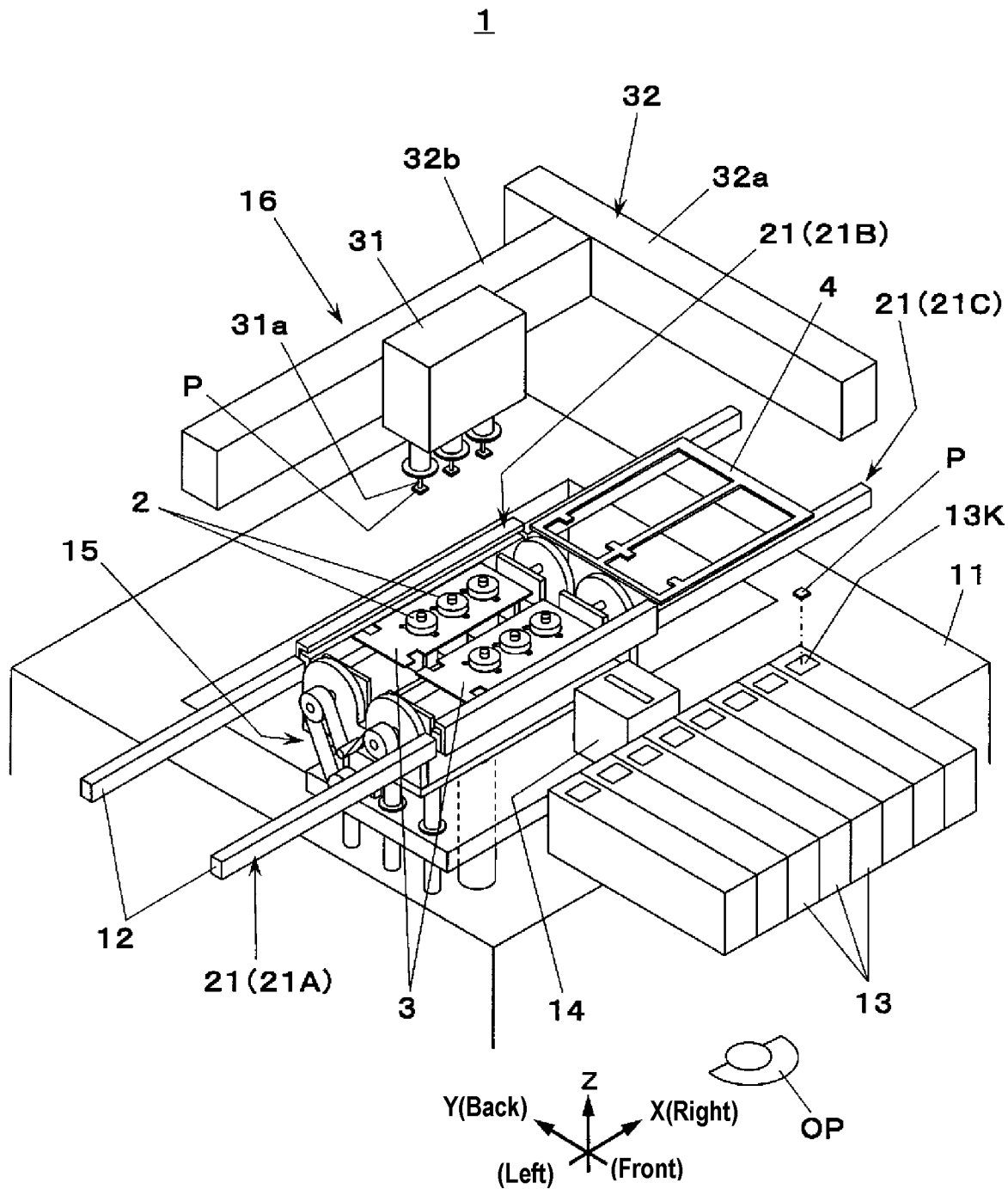
FIG. 1 is a perspective diagram of a component mounter of an exemplary embodiment of the disclosure.
Figure 2A:
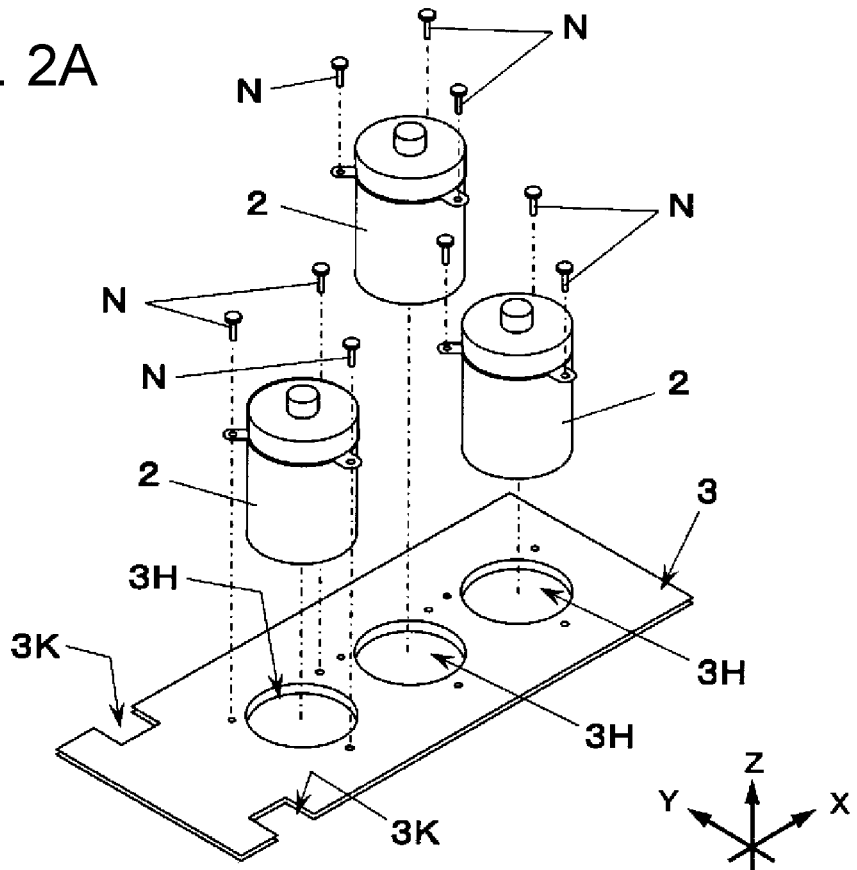
FIGS. 2A and 2B are perspective diagrams illustrating a workpiece holding body with which the component mounter is provided together with workpieces in an exemplary embodiment of the disclosure.
Figure 2B:
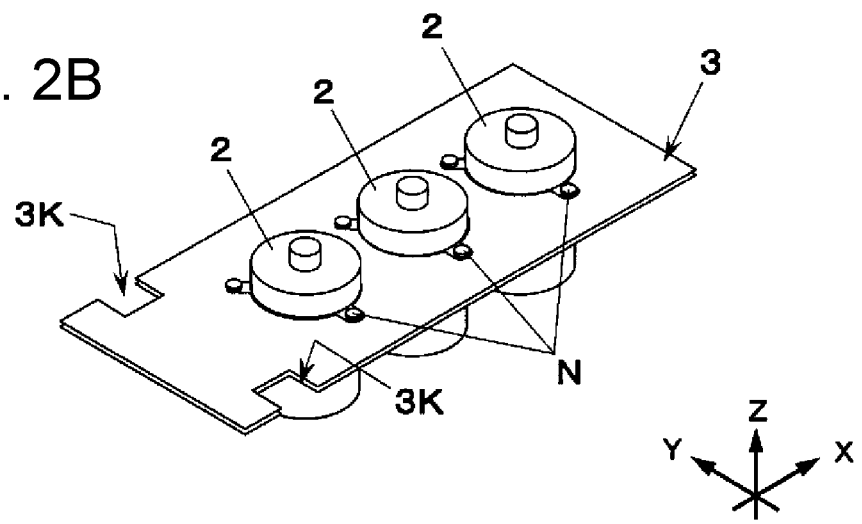

Hereinafter, description will be given of the embodiment of the disclosure with reference to the drawings. FIG. 1 illustrates component mounter 1 in an embodiment of the disclosure. Component mounter 1 is a device which places components P on workpiece 2 as a three-dimensional substrate called a three-dimensional board or the like on workpiece 2. Here, to facilitate explanation, a left-right direction of component mounter 1 as viewed from worker OP is used as an X-axis direction, and a front-back direction is used as a Y-axis direction. An up-down direction is used as a Z-axis direction.

First, description will be given of workpiece holding body 3 which holds workpiece 2, and carrier 4 on which workpiece holding body 3 is placed. In FIGS. 2A to 3B, workpiece holding body 3 is configured of a plate-shape member which extends in the left-right direction (the X-axis direction), and includes a plurality of (here, three) workpiece holding holes 3H which are provided to line up in the left-right direction. After workpiece 2 is inserted through workpiece holding holes 3H from above, workpieces 2 are fixed to workpiece holding body 3 using a plurality of screws N. In other words, in component mounter 1 in the present exemplary embodiment, workpiece holding body 3 is configured to hold a plurality of workpieces 2 in a row. As illustrated in FIGS. 2A to 3B, hollowed-out portions 3K are provided on the left end portion side of each of a pair of long side portions of workpiece holding bodies 3, which face each other in the Y-axis direction.

Figure 3A:
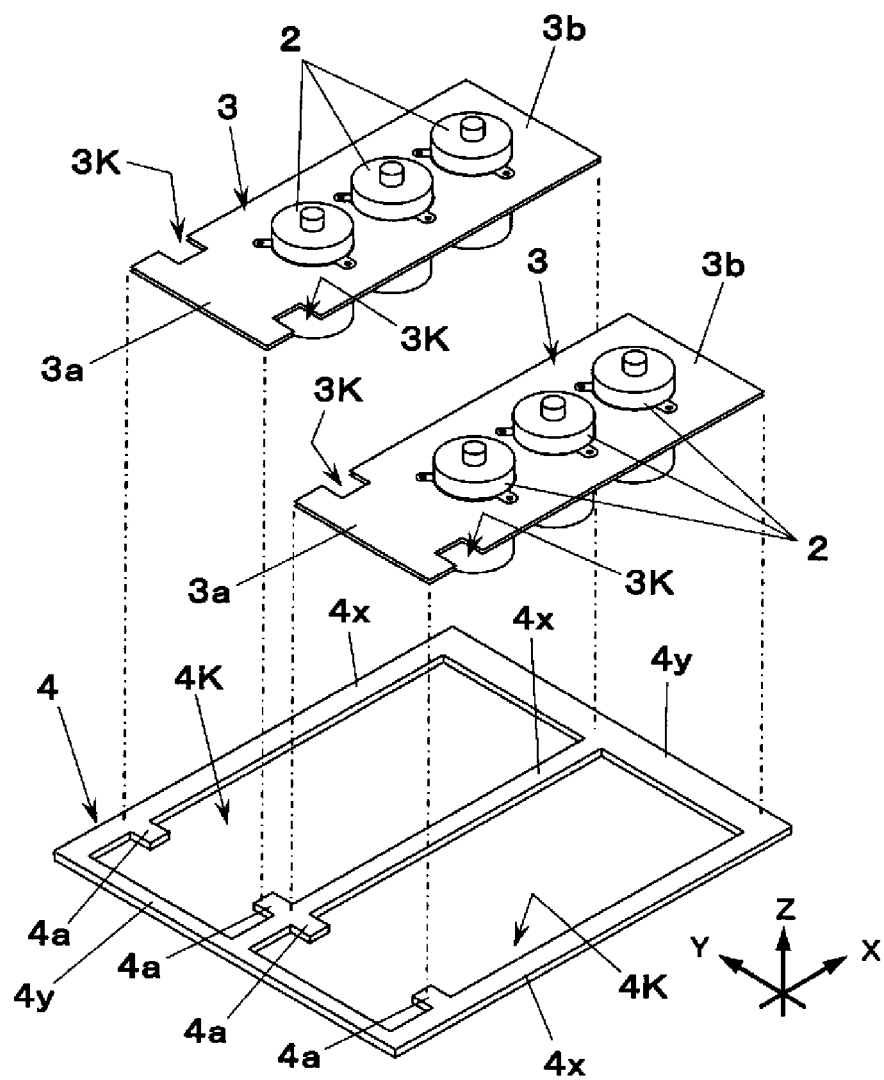
FIGS. 3A and 3B are perspective diagrams illustrating the workpiece holding body with which the component mounter is provided together with a carrier in an exemplary embodiment of the disclosure.
Figure 3B:
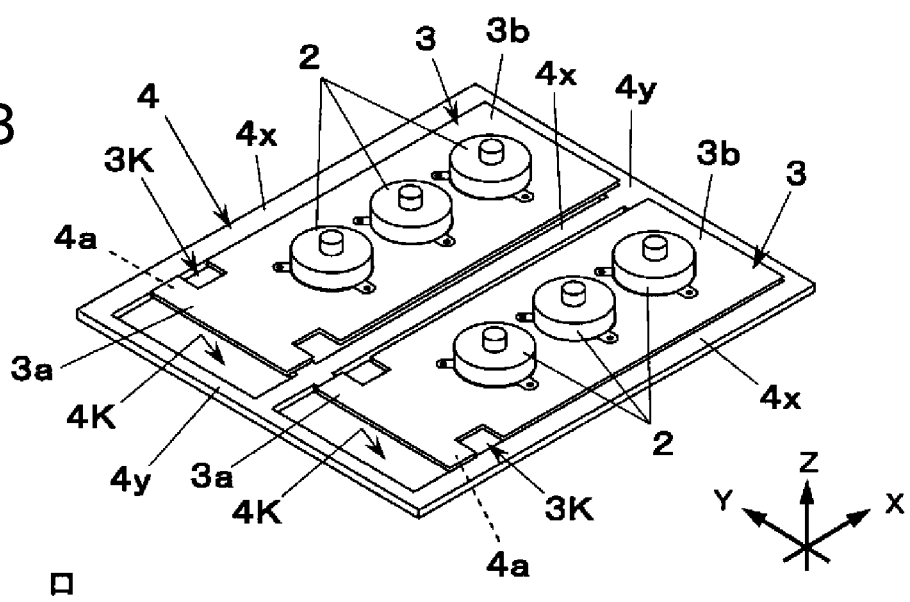

In FIGS. 3A and 3B, carrier 4 is formed in a rectangular frame shape which has three lateral side portions 4x extending parallel to the X-axis direction and two vertical side portions 4y extending parallel to the Y-axis direction, and includes two openings 4K which extend in the X-axis direction and are lined up in the Y-axis direction. Overhanging pieces 4a which overhang into opening 4K are provided in each of the three lateral side portions 4x which face each other in the Y-axis direction with openings 4K interposed therebetween.

Workpiece holding body 3 assumes a state of being placed on carrier 4 by positioning the short side portion (left short side portion 3a) of workpiece holding body 3 on the side at which the pair of hollowed-out portions 3K are provided on the pair of overhanging pieces 4a of carrier 4, and positioning right short side portion 3b of workpiece holding body 3 on vertical side portion 4y of the right side of carrier 4 (FIG. 4A). Meanwhile, if workpiece holding body 3 is shifted in the X-axis direction from this state and the pair of hollowed-out portions 3K of workpiece holding body 3 and the pair of overhanging pieces 4a of carrier 4 are vertically aligned, workpiece holding body 3 passes through opening 4K in the up-down direction in a horizontal posture (FIG. 4B).

In FIG. 1, component mounter 1 is provided with transporter 12, a plurality of part feeders 13, component camera 14, posture adjustment mechanism 15, and component mounting mechanism 16 on table 11. Transporter 12 uses the X-axis direction as the transport direction, and is provided with three transport conveyors 21 in the transport direction. Three conveyors 21 are carry-in conveyor 21A, working conveyor 21B, and carry-out conveyor 21C from the upstream side (left side) in the transport direction.

Each conveyor 21 supports, from below, a pair of end portions which face each other in the Y-axis direction of carrier 4, and transports carrier 4 in the X-axis direction. Each part feeder 13 is configured of a tape feeder, for example, and is attached to table 11 in a freely detachable manner. Each part feeder 13 supplies components P to component supply port 13K which is provided on the side that is close to transporter 12. Component camera 14 is provided on table 11 between transporter 12 and part feeder 13 in a state in which the imaging visual field faces upward.

Posture adjustment mechanism 15 is provided under working conveyor 21B. As described later, posture adjustment mechanism 15 separates workpiece holding body 3 from carrier 4 which is transported to the working position by working conveyor 21B, and then collectively adjusts the postures of the plurality of workpieces 2 which are held in workpiece holding body 3.

In FIG. 1, component mounting mechanism 16 includes placing head 31 and head moving mechanism 32. Placing head 31 is provided with a plurality of suction nozzles 31a which extend downward. Placing head 31 moves (lifts and lowers) each suction nozzle 31a in the Z-axis direction and rotates each suction nozzle 31a around the Z axis, introduces a vacuum pressure which is supplied from a vacuum source (not illustrated), and applies vacuum suction force to the bottom end of each suction nozzle 31a.

Head moving mechanism 32 is provided with fixed beam 32a which extends in the Y-axis direction and movable beam 32b which extends in the X-axis direction. Placing head 31 is moved in the X-axis direction along movable beam 32b, and movable beam 32b is moved in the Y-axis direction along fixed beam 32a. Therefore, it is possible to move placing head 31 in a horizontal plane using head moving mechanism 32.

Figure 5:
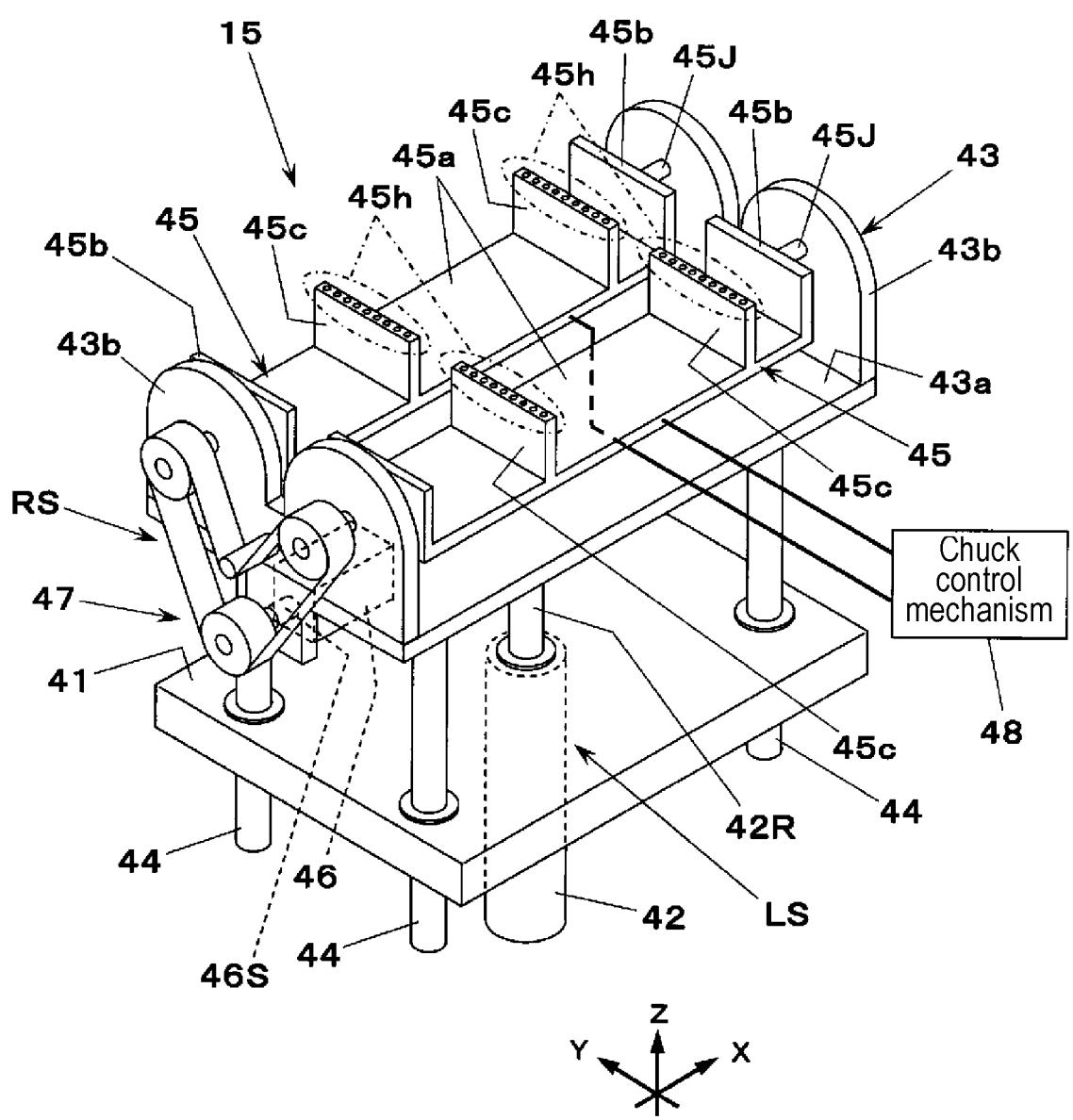
FIG. 5 is a perspective diagram of a posture adjustment mechanism with which the component mounter is provided in an exemplary embodiment of the disclosure.
Figure 6:
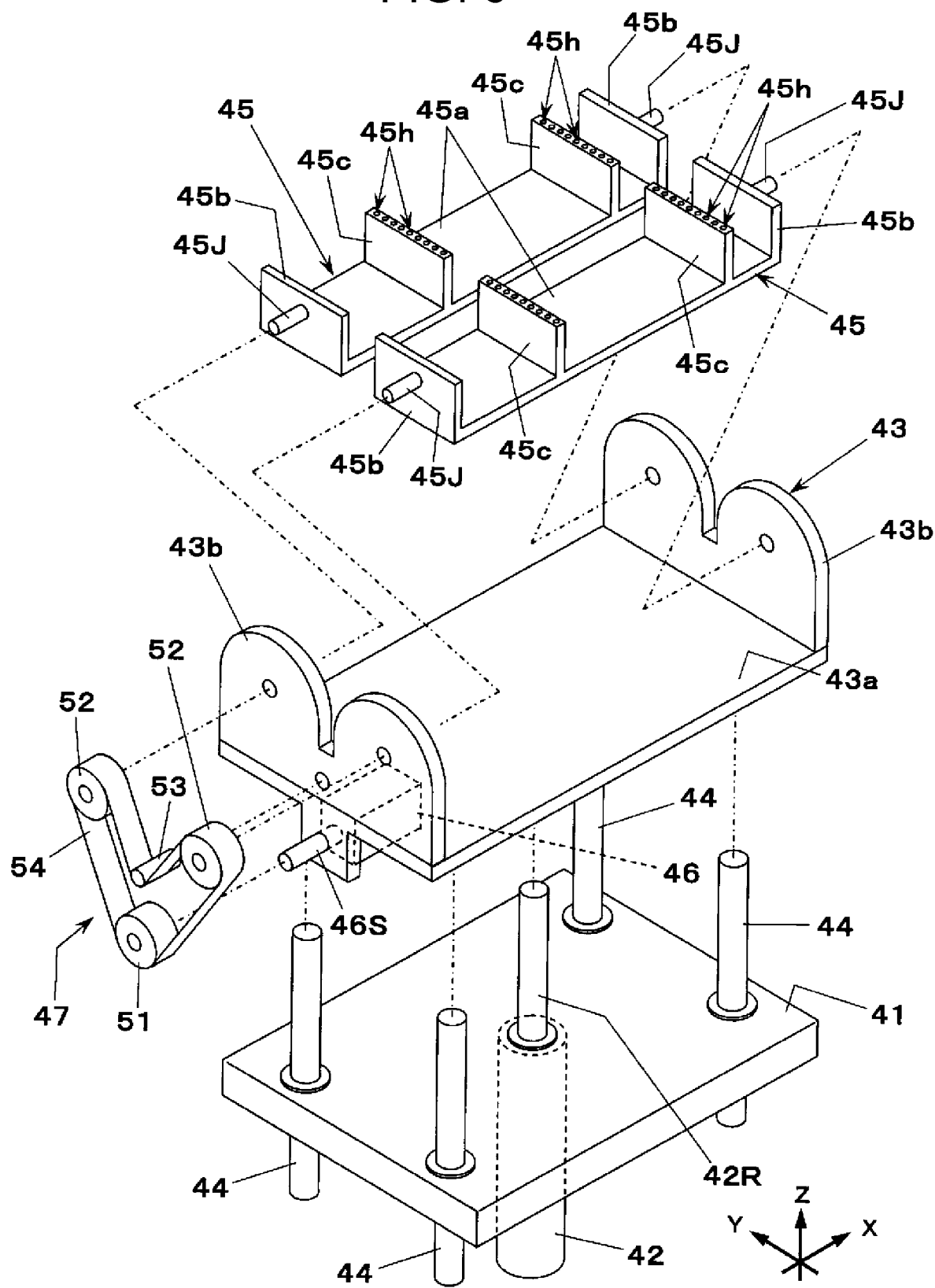
FIG. 6 is an exploded perspective diagram of the posture adjustment mechanism with which the component mounter is provided in an exemplary embodiment of the disclosure.

In FIGS. 5 and 6, posture adjustment mechanism 15 is provided with fixed base 41, lifting-lowering cylinder 42, lifting-lowering base 43, a plurality of guide rods 44, two chuck portions 45, rotation motor 46, and belt transmission mechanism 47. Fixed base 41 is configured of a flat plate member which extends in the horizontal plane, and is provided to be fixed to table 11 below working conveyor 21B. Lifting-lowering cylinder 42 is attached to the bottom surface side of the central portion of fixed base 41. Piston rod 42R of lifting-lowering cylinder 42 penetrates fixed base 41 from below to extend upward. Lifting-lowering base 43 is attached to the top end of piston rod 42R of lifting-lowering cylinder 42.

In FIGS. 5 and 6, lifting-lowering base 43 includes horizontal portion 43a which extends in the horizontal plane and right and left vertical portions 43b which extend vertically upward from the left and right end portions of horizontal portion 43a. The plurality of guide rods 44 extend downward from the four corners of the bottom surface of horizontal portion 43a of lifting-lowering base 43 and extend downward through fixed base 41. Each guide rod 44 slides freely in the Z-axis direction with respect to fixed base 41.

In FIGS. 5 and 6, each chuck portion 45 includes bottom portion 45a and left and right wall portions 45b. Bottom portion 45a has a shape extending in the X-axis direction, and the left and right wall portions 45b extend upward from the left and right end portions, respectively, of bottom portion 45a.

On the left surface of left side wall portion 45b and the right surface of right side wall portion 45b, respectively, rotation shaft 45J is provided to extend in the X-axis direction. The right and left rotation shafts 45J extend on the same axial line (the X axis) and extend through the left and right vertical portions 43b, respectively, in the X-axis direction. Therefore, chuck portions 45 rotate freely around the axial line of the left-right pair of rotation shafts 45J. Of the left and right rotation shafts 45J with which each chuck portion 45 is provided, rotation shaft 45J of the left side extends leftward through wall portion 45b of the left side of lifting-lowering base 43.

A plurality of (here, two) holding body supporters 45c are provided to extend upward in an intermediate portion in the left-right direction of bottom portion 45a of chuck portion 45. A plurality of suction openings 45h are provided on the top surface of each holding body supporter 45c. It is possible to generate a vacuum suction force in the plurality of suction openings 45h through chuck control mechanism 48 (FIG. 5), and so it is possible to chuck (suction hold) workpiece holding body 3, which holds the plurality of workpieces 2, from below.

As illustrated in FIGS. 1 and 5, two chuck portions 45 are provided to line up in the Y-axis direction, and each chuck portion 45 is configured to chuck two workpiece holding bodies 3 which hold a plurality of workpieces 2 which are lined up in a row in the X-axis direction. In other words, in the present exemplary embodiment, a configuration is adopted in which two (that is, a plurality of) chuck portions 45 are provided on lifting-lowering base 43 to line up in the horizontal direction (the Y-axis direction) which is orthogonal to the lining up direction (the X-axis direction) of the plurality of workpieces 2 which are held in workpiece holding body 3 which is chucked by chuck portion 45.

In FIGS. 5 and 6, rotation motor 46 is attached to the bottom surface side of horizontal portion 43a of lifting-lowering base 43 with drive shaft 46S facing to the left. Drive shaft 46S protrudes and extends to the left side of vertical portion 43b of the left side of lifting-lowering base 43.

In FIG. 6, belt transmission mechanism 47 is provided with drive pulley 51, two follower pulleys 52, tension roller 53, and transmission belt 54. Drive pulley 51 is attached to drive shaft 46S of rotation motor 46. Two follower pulleys 52 are attached to corresponding two rotation shafts 45J which protrude and extend leftward from vertical portion 43b of the left side of lifting-lowering base 43. Tension roller 53 is provided to protrude and extend leftward from the left surface side of vertical portion 43b of the left side of lifting-lowering base 43. Transmission belt 54 is wound around drive pulley 51, two follower pulleys 52, and tension roller 53. A suitable degree of tension is applied to transmission belt 54 by tension roller 53.

When rotation motor 46 operates and drive pulley 51 is rotationally driven by drive shaft 46S, the rotational motive force of drive pulley 51 is transmitted to two follower pulleys 52 by transmission belt 54. Accordingly, two front and rear chuck portions 45 are rotated around the axial line (the X axis) of the corresponding rotation shaft 45J through two rotation shafts 45J which are connected to two follower pulleys 52. In other words, in the present exemplary embodiment, rotation motor 46, belt transmission mechanism 47, and the like configure a rotation mechanism RS which rotates two chuck portions 45 around the axial lines which extend in the lining up direction (the X-axis direction) of the plurality of workpieces 2 which are held in workpiece holding body 3 (FIG. 5).

When piston rod 42R is driven by lifting-lowering cylinder 42, lifting-lowering base 43 which is attached to piston rod 42R is lifted and lowered with respect to fixed base 41 in a state of being guided by the plurality of guide rods 44. In other words, lifting-lowering cylinder 42, lifting-lowering base 43, and the like configure lifting-lowering mechanism LS which lifts and lowers two front and rear chuck portions 45 together with rotation mechanism RS (FIG. 5).

Figure 7:
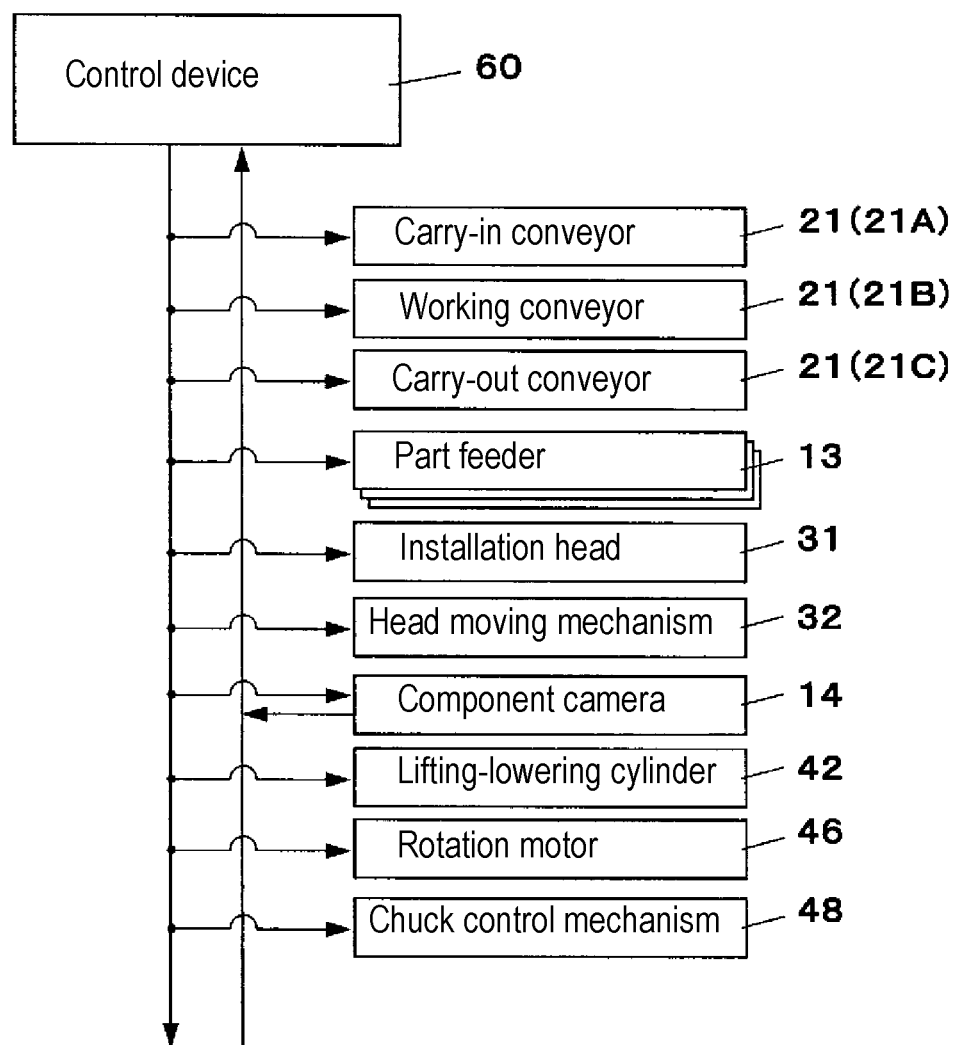
FIG. 7 is a block diagram illustrating a control system of the component mounter in an exemplary embodiment of the disclosure.

In FIG. 7, control device 60 of component mounter 1 controls transportation of carrier 4 by transport conveyor 21 (carry-in conveyor 21A, working conveyor 21B, and carry-out conveyor 21C), supplying of components P by part feeder 13, lifting, lowering, and rotation of each suction nozzle 31a by placing head 31, suction by each suction nozzle 31a, moving of placing head 31 by head moving mechanism 32, and imaging by component camera 14. Control device 60 controls the lifting and lowering of lifting-lowering base 43 by lifting-lowering cylinder 42, the rotation of two chuck portions 45 by rotation motor 46, and the chucking of each chuck portion 45 by chuck control mechanism 48.

Figure 8A:
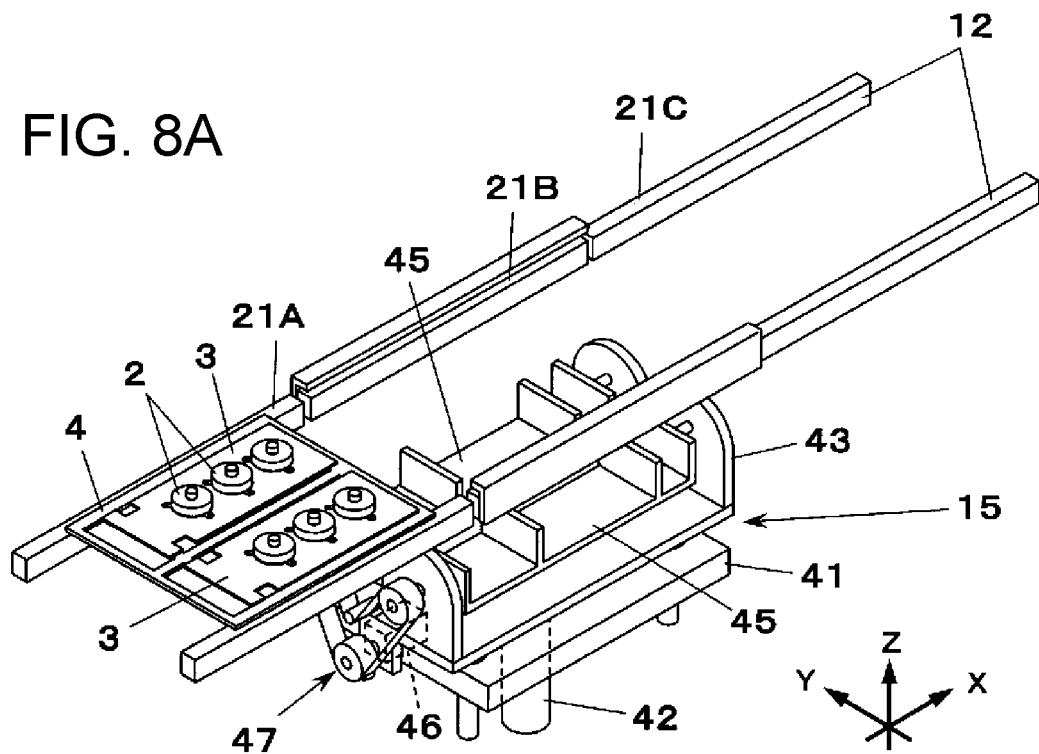
FIGS. 8A and 8B are respectively a perspective diagram and a side surface diagram illustrating the posture adjustment mechanism with which the component mounter is provided together with a transport conveyor in an exemplary embodiment of the disclosure.
Figure 8B:
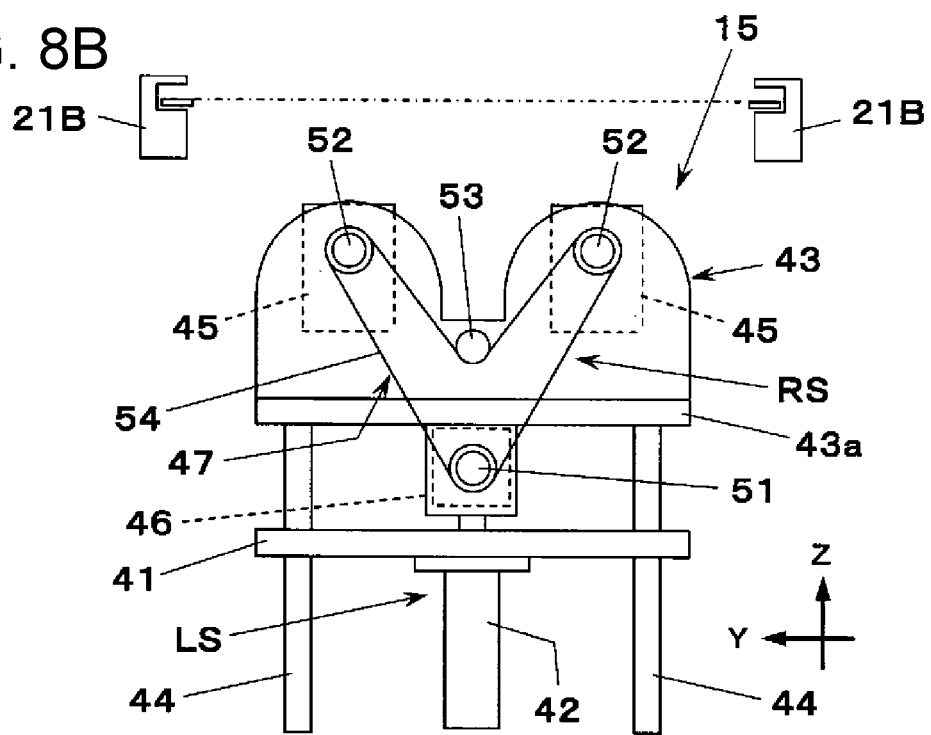

Next, description will be given of an execution procedure of a component placing operation in which the posture of a plurality of workpieces 2 is adjusted to mount components P on each workpiece 2 using component mounter 1. In the component placing operation, first, carrier 4 is supplied to carry-in transporter 21A of transporter 12 in a state in which two workpiece holding bodies 3, each of which holds a plurality of (here, three) workpieces 2, are placed on carrier 4 (FIG. 8A). In this state, carrier 4 is not positioned above posture adjustment mechanism 15 (FIG. 8B).

Figure 9A:
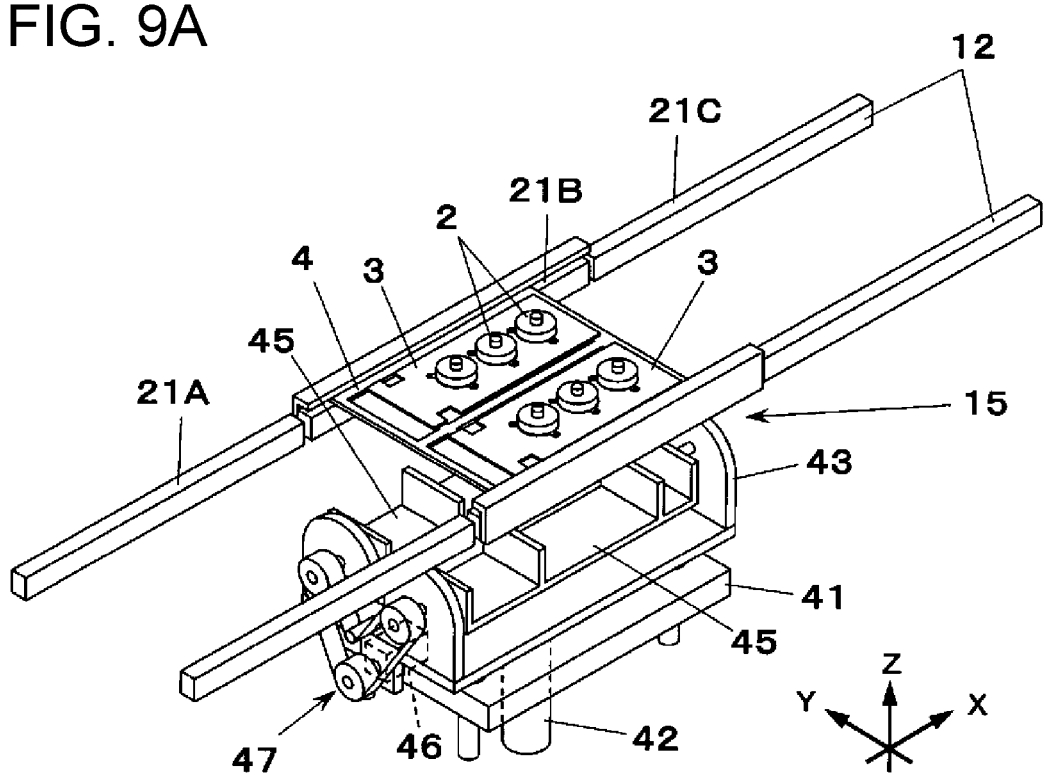
FIGS. 9A and 9B are respectively a perspective diagram and a side surface diagram illustrating the posture adjustment mechanism with which the component mounter is provided together with a transport conveyor in an exemplary embodiment of the disclosure.
Figure 9B:
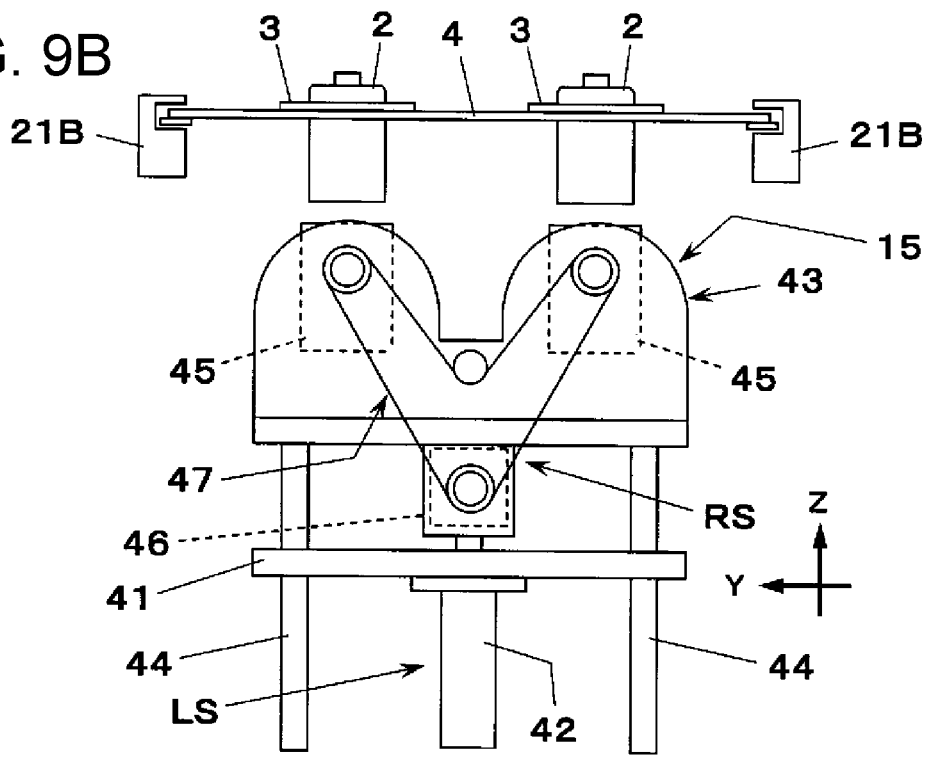

Once carrier 4 is supplied to carry-in conveyor 21A, control device 60 operates carry-in conveyor 21A to deliver carrier 4 to working conveyor 21B. Work conveyor 21B is operated and carrier 4 is positioned at a predetermined working position (FIG. 9A). When carrier 4 is positioned at the working position, two workpiece holding bodies 3 which are placed on carrier 4 assume a state of being positioned above two chuck portions 45 (FIG. 9B).

Figure 10A:
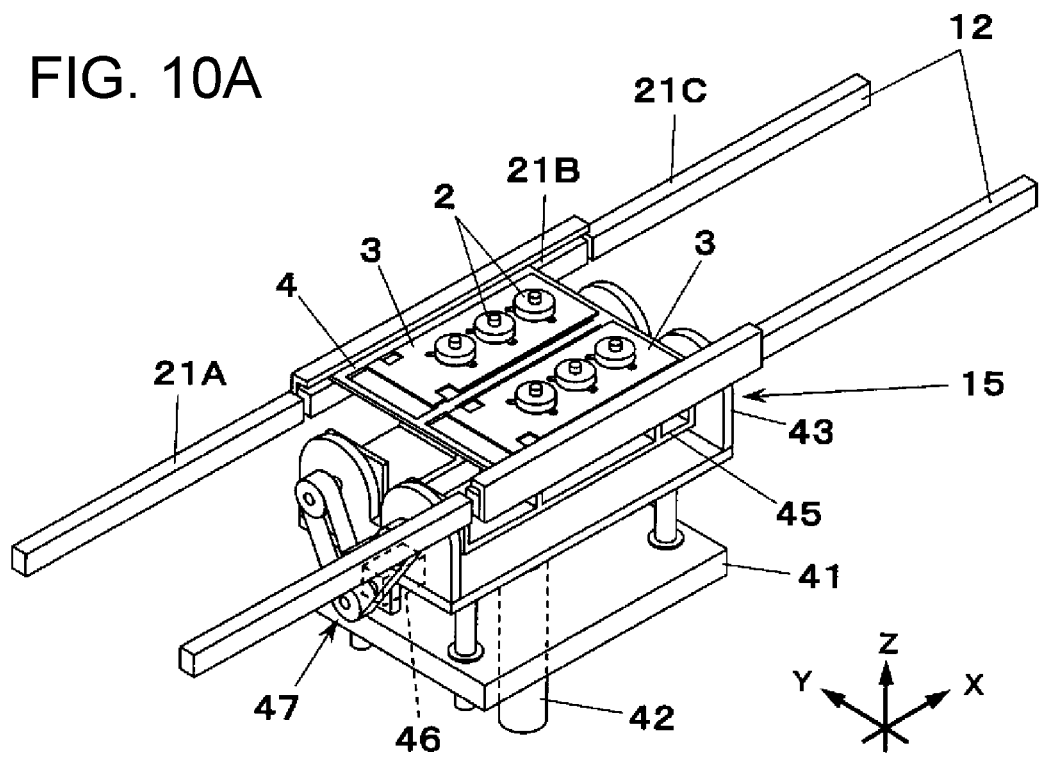
FIGS. 10A and 10B are respectively a perspective diagram and a side surface diagram illustrating the posture adjustment mechanism with which the component mounter is provided together with a transport conveyor in an exemplary embodiment of the disclosure.
Figure 10B:
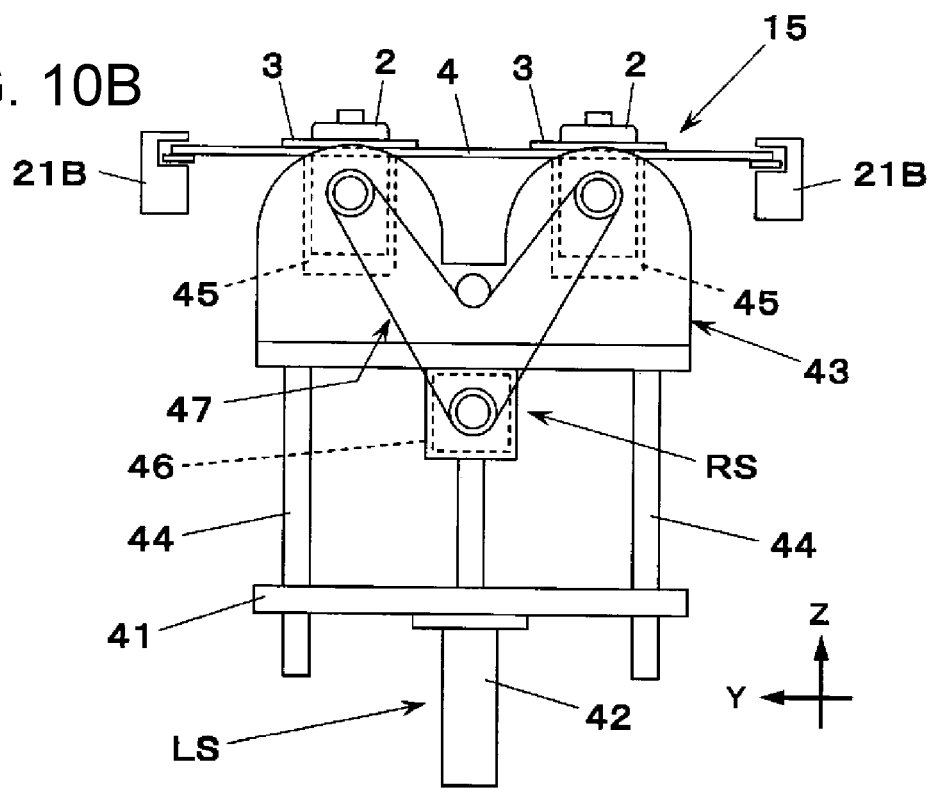

Once a state is achieved in which carrier 4 is positioned at the working position and two workpiece holding bodies 3 which are placed on carrier 4 are positioned above two chuck portions 45, control device 60 lifts lifting-lowering base 43 using lifting-lowering cylinder 42. Then it causes the top surfaces of each of the plurality of holding body supporters 45c with which each chuck portion 45 is provided to come into contact with workpiece holding body 3 that is positioned thereabove from below. Once the top surface of the plurality of holding body supporters 45c comes into contact with workpiece holding body 3 and supports workpiece holding body 3, control device 60 controls chuck control mechanism 48 to generate a vacuum suction force in suction openings 45h which are provided in each holding body supporter 45c and to cause chuck portion 45 to chuck workpiece holding body 3 (FIGS. 10A and 10B).

Figure 12A:
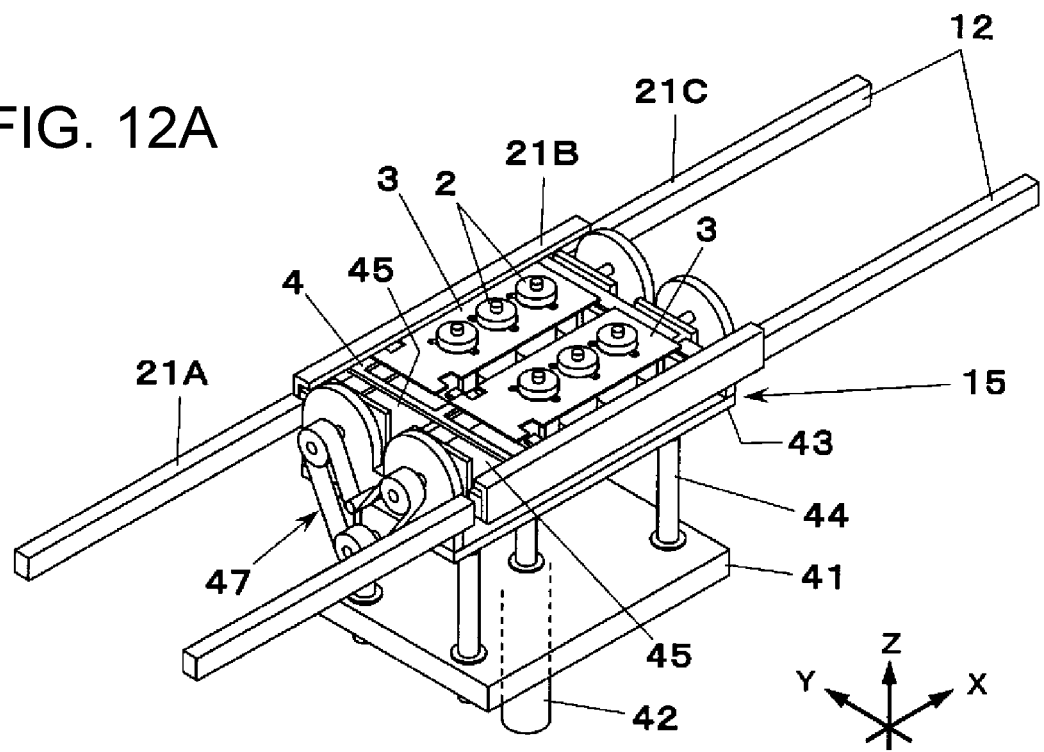
FIGS. 12A and 12B are respectively a perspective diagram and a side surface diagram illustrating the posture adjustment mechanism with which the component mounter is provided together with a transport conveyor in an exemplary embodiment of the disclosure.
Figure 12B:
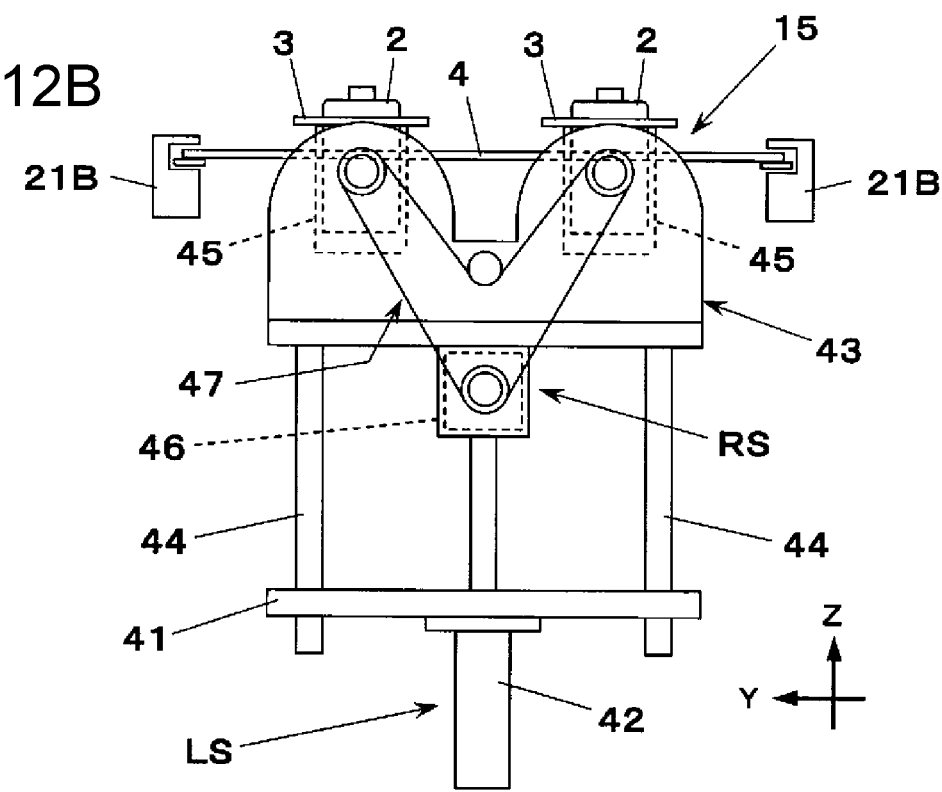

Once two chuck portions 45 chuck two workpiece holding bodies 3, control device 60 lifts lifting-lowering base 43 using lifting-lowering cylinder 42, lifts two workpiece holding bodies 3 using two chuck portions 45, and causes two workpiece holding bodies 3 to separate from carrier 4 (FIGS. 11A and 11B). Once two workpiece holding bodies 3 separate from carrier 4, control device 60 operates working conveyor 21B to move carrier 4 slightly in the X-axis direction (FIGS. 12A and 12B). At this time, the direction in which carrier 4 is moved using working conveyor 21B is a direction (the direction from FIG. 4A to 4B) in which each workpiece holding body 3 passes under opening 4K of carrier 4.

Figure 13A:
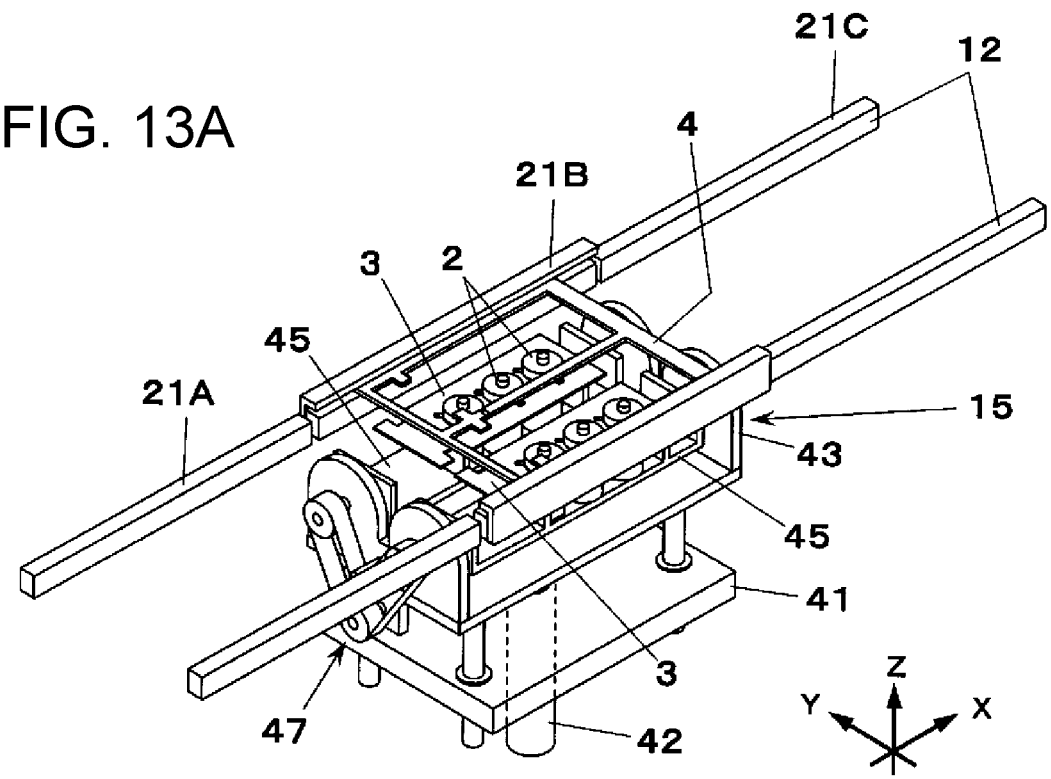
FIGS. 13A and 13B are respectively a perspective diagram and a side surface diagram illustrating the posture adjustment mechanism with which the component mounter is provided together with a transport conveyor in an exemplary embodiment of the disclosure.
Figure 13B:
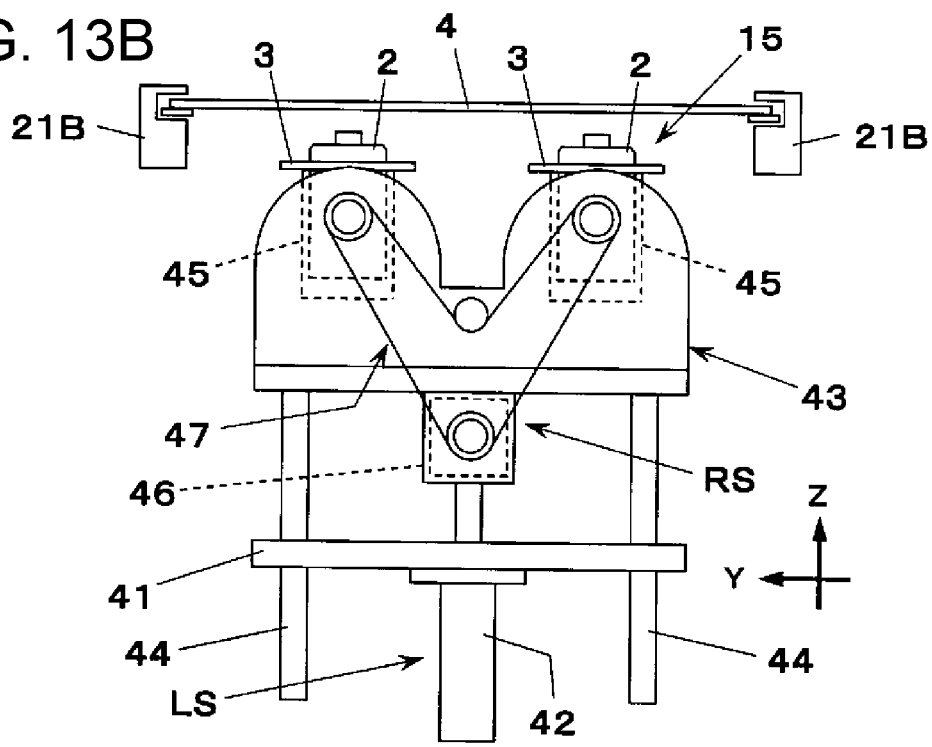

Once carrier 4 is moved in the X-axis direction using working conveyor 21B, control device 60 lowers lifting-lowering base 43 using lifting-lowering cylinder 42, two workpiece holding bodies 3 which are chucked using two chuck portions 45 pass through opening 4K of carrier 4 from above carrier 4 to under carrier 4. All of the plurality of workpieces 2 which are held in two workpiece holding bodies 3 are positioned under carrier 4 (FIGS. 13A and 13B). Accordingly, two workpiece holding bodies 3 assume a state of being separated from carrier 4.

In the separation operation between workpiece holding body 3 and carrier 4, lifting-lowering mechanism LS separates carrier 4 from workpiece holding body 3 by performing an operation of lifting and lowering chuck portion 45 which chucks workpiece holding body 3 with respect to carrier 4 together with an operation of moving carrier 4 in the transport direction (the X-axis direction) using transport conveyor 21 (specifically, working conveyor 21B).

In this manner, in component mounter 1 in the present exemplary embodiment, carrier 4 is configured in a frame shape including openings 4K in inner portion of carrier 4, and workpiece holding body 3 is separated from carrier 4 by being caused to pass under openings 4K by being transported to the predetermined working position using transport conveyor 21 in a state of being placed on carrier 4 at a position at which workpiece holding body 3 does not fall from openings 4K of carrier 4, in other words, avoids openings 4K of carrier 4, and through the linked operation of the lifting and lowering of chuck portion 45 by lifting-lowering mechanism LS and the movement of carrier 4 in the transport direction (the X-axis direction) by transport conveyor 21.

Figure 14A:
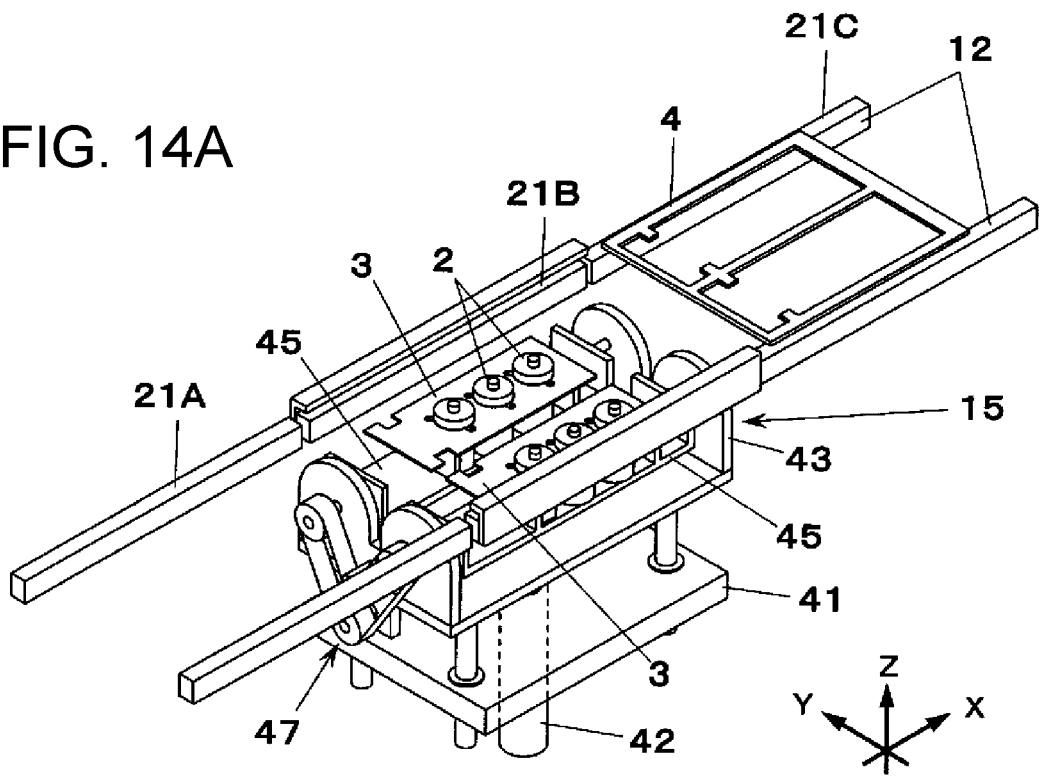
FIGS. 14A and 14B are respectively a perspective diagram and a side surface diagram illustrating the posture adjustment mechanism with which the component mounter is provided together with a transport conveyor in an exemplary embodiment of the disclosure.
Figure 14B:
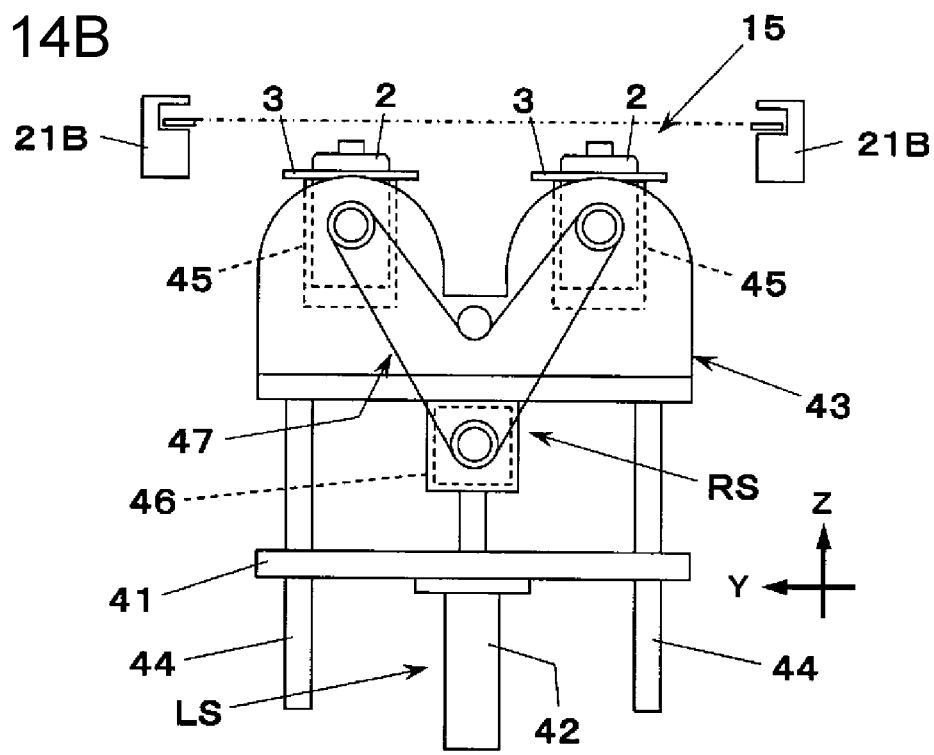

Once two workpiece holding bodies 3 are separated from carrier 4, control device 60 operates working conveyor 21B to deliver carrier 4 to carry-out conveyor 21C. Once carrier 4 is delivered to carry-out conveyor 21C, carrier 4 waits above carry-out conveyor 21C (FIGS. 14A and 14B). Here, carrier 4 which is separated from workpiece holding body 3 is delivered from working conveyor 21B to carry-out conveyor 21C; however, carrier 4 may be delivered from working conveyor 21B to carry-in conveyor 21A.

Figure 15A:
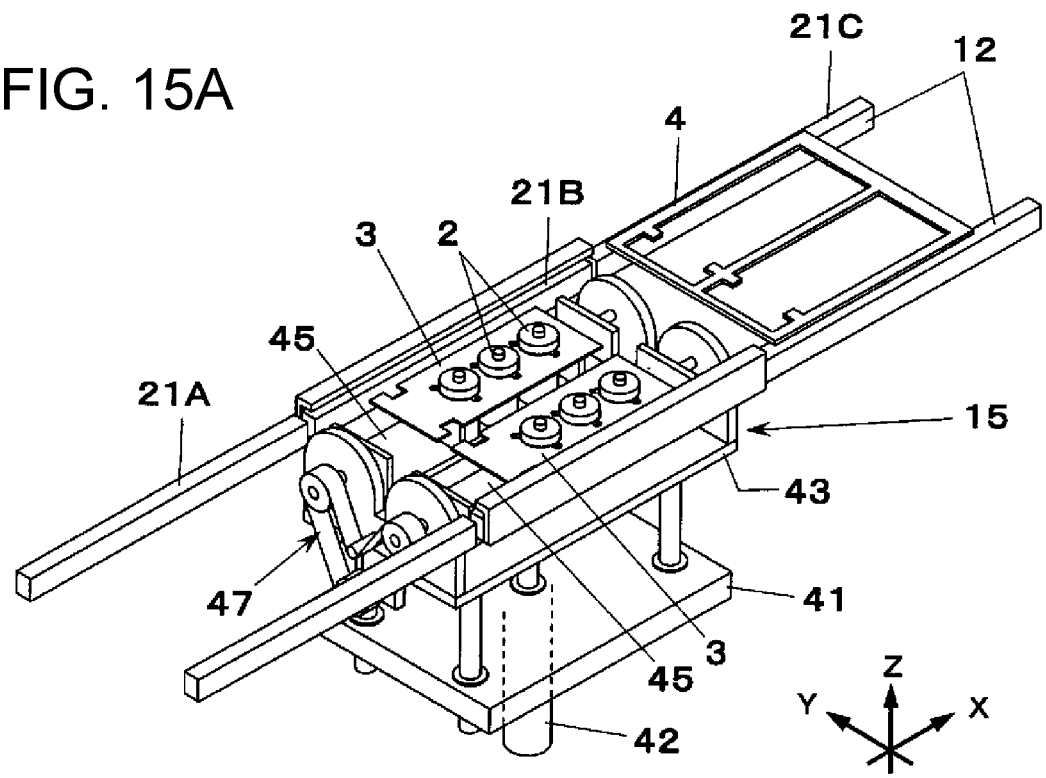
FIGS. 15A and 15B are respectively a perspective diagram and a side surface diagram illustrating the posture adjustment mechanism with which the component mounter is provided together with a transport conveyor in an exemplary embodiment of the disclosure.
Figure 15B:
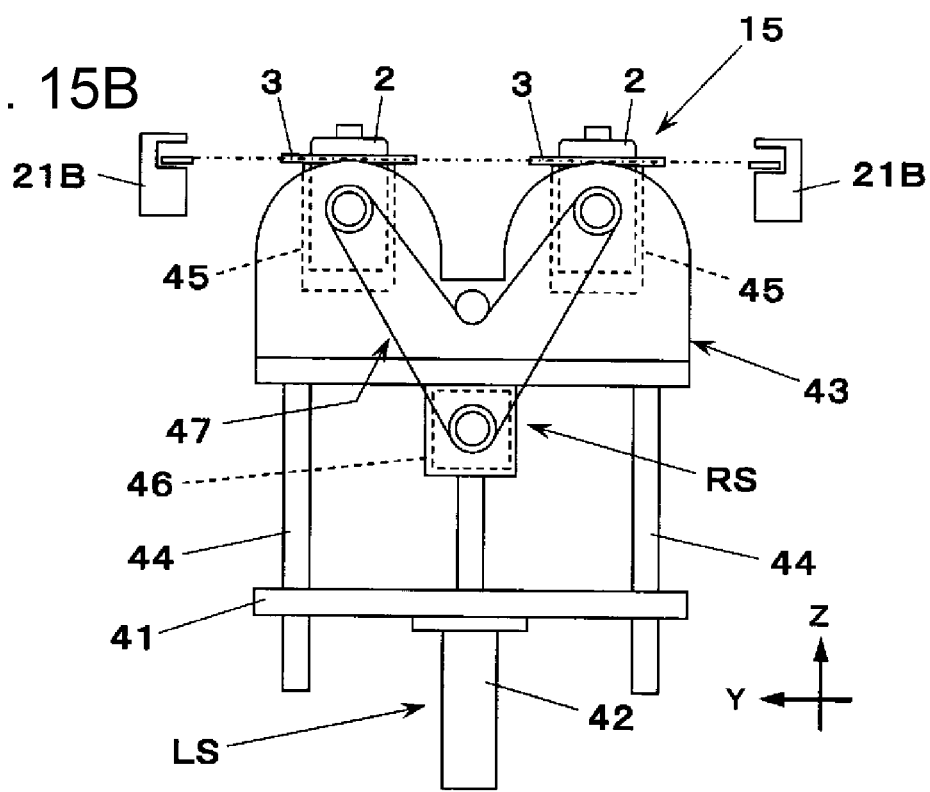
Figure 16A:
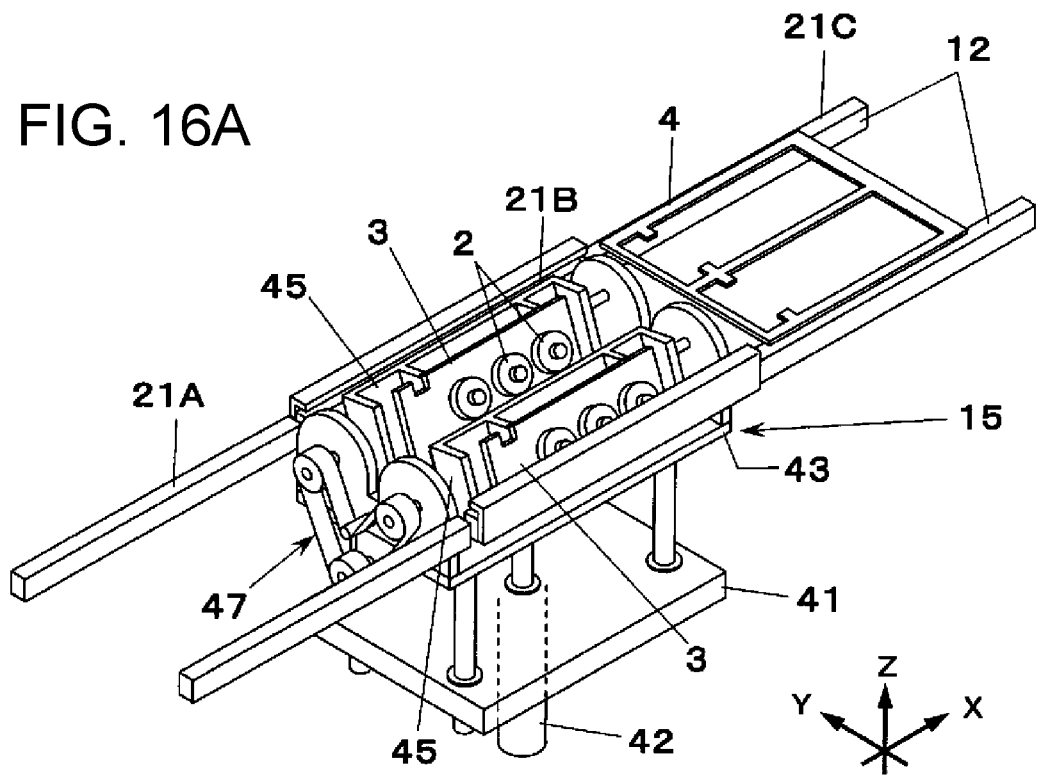
FIGS. 16A and 16B are respectively a perspective diagram and a side surface diagram illustrating the posture adjustment mechanism with which the component mounter is provided together with a transport conveyor in an exemplary embodiment of the disclosure.
Figure 16B:
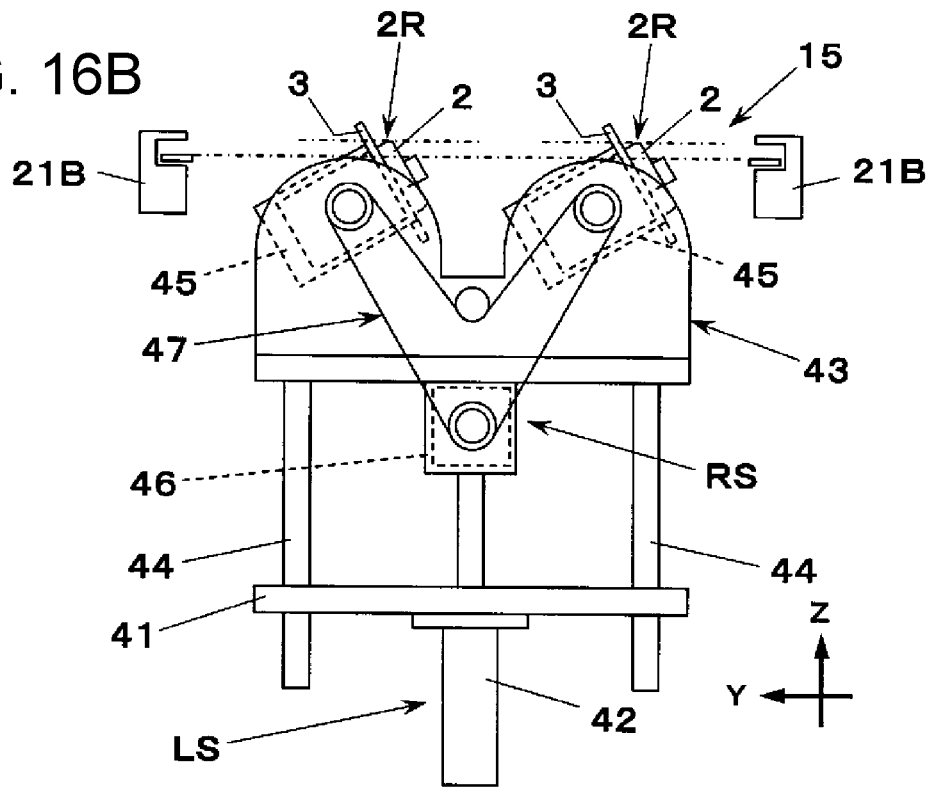

Once carrier 4 is delivered to carry-out conveyor 21C, control device 60 lifts lifting-lowering base 43 using lifting-lowering cylinder 42 (FIGS. 15A and 15B). The postures of the plurality of workpieces 2 which are held by two workpiece holding bodies 3 are collectively adjusted by operating rotation motor 46 to rotationally drive drive pulley 51 using drive shaft 46S, and causing two chuck portions 45 to rotate around the axial lines of rotation shafts 45J at the same time, in the same direction, at the same angle through belt transmission mechanism 47 (FIGS. 16A and 16B. Here, chuck portion 45 is rotated such that the surface of component placing part 2R faces upward (assumes a horizontal posture). Each workpiece 2 is attached to workpiece holding body 3 such that the surface of component placing part 2R faces upward due to the turning operation of chuck portion 45.

As described above, in component mounter 1 according to the present exemplary embodiment, the rotational motive force which is output by one motor (rotation motor 46) is transmitted by transmission belt 54 to rotate the plurality of chuck portions 45 in the same direction at the same angle. Rotation mechanism RS including rotation motor 46 causes chuck portion 45 which chucks workpiece holding body 3 to rotate around the axial line (the X axis) extending in the lining up direction of the plurality of workpieces 2 which are held in workpiece holding body 3, and the postures of the plurality of workpieces 2 which are held in workpiece holding body 3 which is separated from carrier 4 are collectively adjusted.

In component mounter 1 in the present exemplary embodiment, (1) workpiece holding body 3 which holds the plurality of workpieces 2 lined up in a row in the X-axis direction is placed on carrier 4 and transported to a predetermined position (the working position) by transport conveyor 21 (2). Transported workpiece holding body 3 which is on carrier 4 is chucked by chuck portion 45, and then, (3) chuck portion 45 is lifted and lowered with respect to carrier 4 using lifting-lowering mechanism LS and moving carrier 4 in the transport direction (the X-axis direction) using transport conveyor 21. By these operations, workpiece holding body 3 is separated from carrier 4 (4) By rotating chuck portion 45 which chucks workpiece holding body 3 around the axial line (the X axis) which extends in the lining up (=aligning) direction of the plurality of workpieces 2 using rotation mechanism RS, the postures of the plurality of workpieces 2 are collectively adjusted.

Figure 17A:
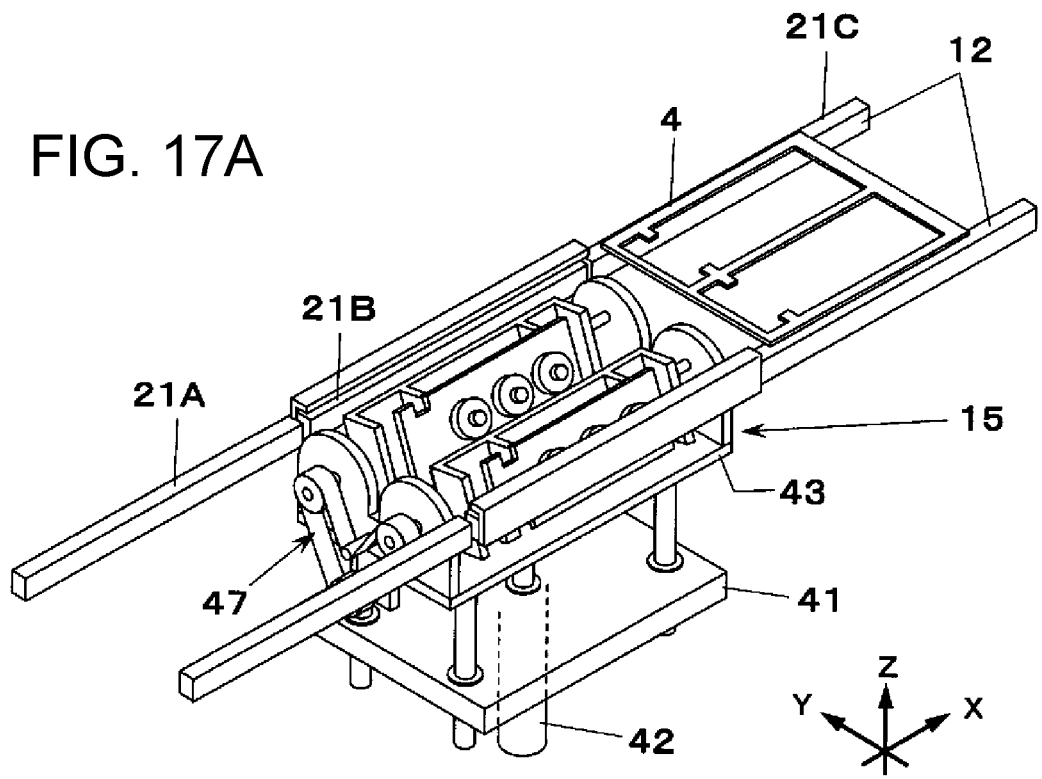
FIGS. 17A and 17B are respectively a perspective diagram and a side surface diagram illustrating the posture adjustment mechanism with which the component mounter is provided together with a transport conveyor in an exemplary embodiment of the disclosure.
Figure 17B:
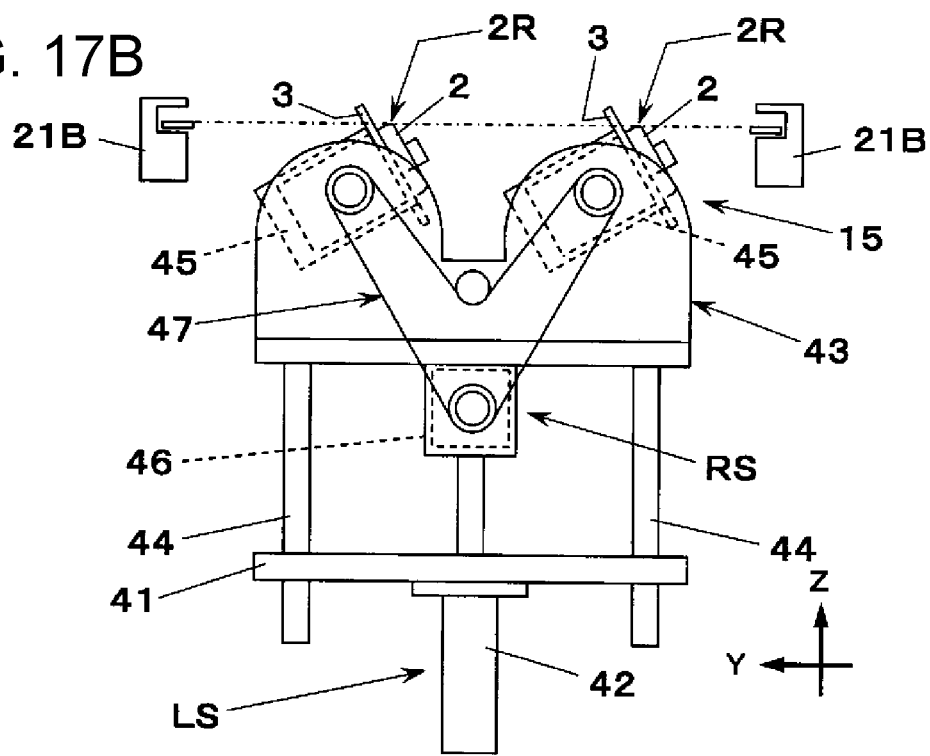

After collectively adjusting the postures of the plurality of workpieces 2, control device 60 lifts and lowers lifting-lowering base 43 using lifting-lowering cylinder 42, and ensures that each component placing part 2R of the plurality of workpieces 2 is matched with the placing height at which components P are placed by suction nozzles 31a (FIGS. 17A and 17B). As described above, in the present exemplary embodiment, the plurality of workpieces 2 with adjusted postures are collectively positioned at a predetermined height (the placing height) using the lifting and lowering (that is, the lifting and lowering of chuck portions 45) operation of lifting-lowering base 43 by lifting-lowering mechanism LS.

In posture adjustment mechanism 15 with which component mounter 1 in the present exemplary embodiment is provided, the part at which it is possible to perform the posture adjustment in workpiece 2 is limited; however, since posture adjustment mechanism 15 is to be configured such that the surface of component placing part 2R on which components P are to be placed faces a predetermined direction (for example, upward). Therefore, in a case in which component placing part 2R is one location for one workpiece 2, this is cost effective in manufacturing due to the simplification in the configuration of posture adjustment mechanism 15.

Once the postures of the plurality of workpieces 2 which are held in workpiece holding body 3 are collectively adjusted, control device 60 operates part feeder 13 to supply components P to component supply port 13K, and moves placing head 31 above part feeder 13 using head moving mechanism 32. Components P are sucked by each of the plurality of suction nozzles 31a with which placing head 31 is provided.

Figure 18A:
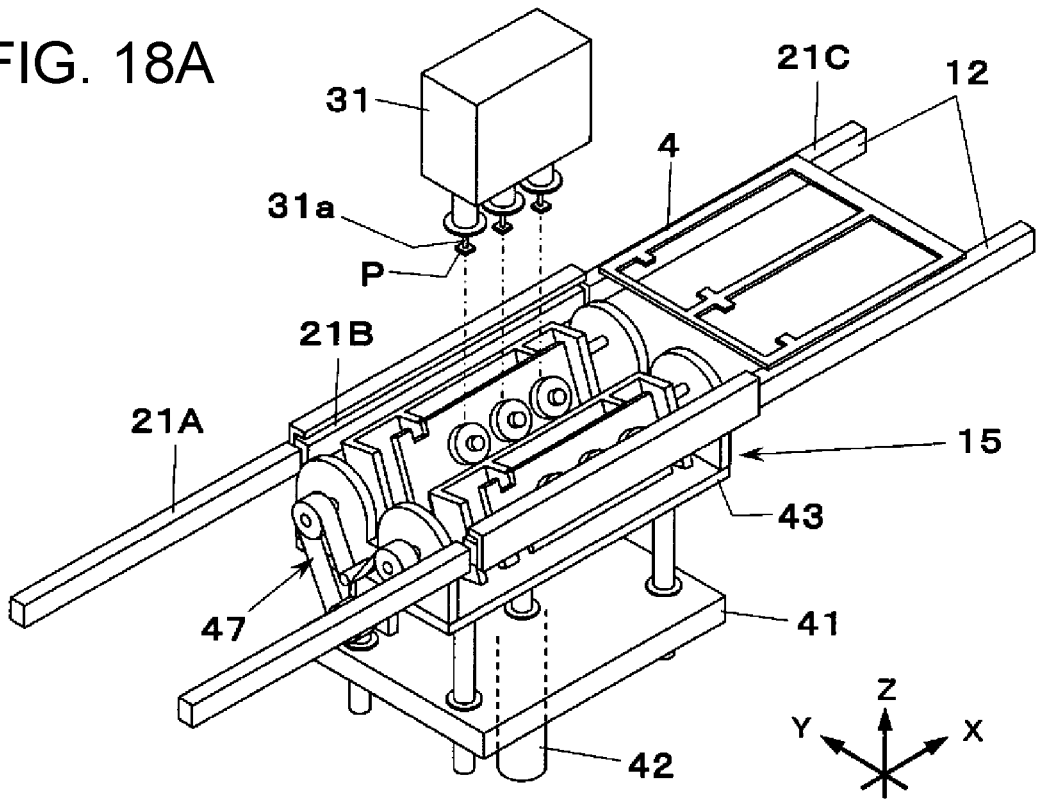
FIGS. 18A and 18B are respectively a perspective diagram and a side surface diagram illustrating the posture adjustment mechanism with which the component mounter is provided together with a transport conveyor in an exemplary embodiment of the disclosure.
Figure 18B:
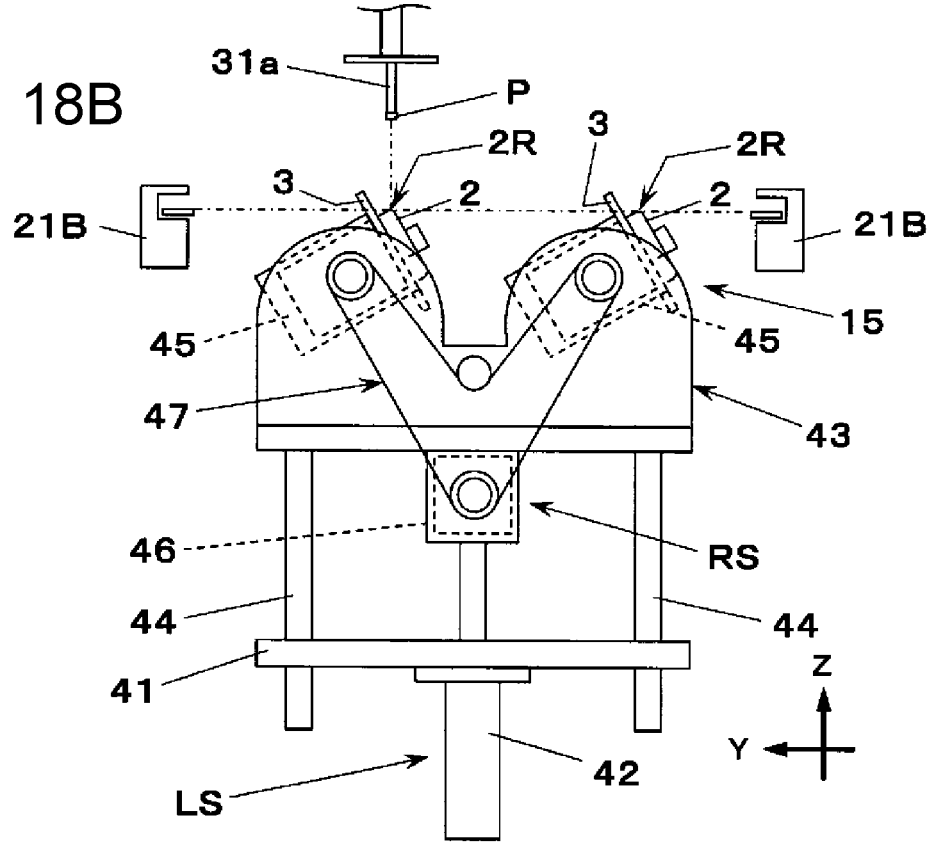

Once components P are sucked by each of the plurality of suction nozzles 31a, control device 60 moves placing head 31 using head moving mechanism 32, and ensures that the plurality of components P which are sucked by suction nozzle 31a sequentially pass over component camera 14. Once component camera 14 recognizes each component P which passes thereover, control device 60 moves placing head 31 above working conveyor 21B using head moving mechanism 32, and positions component P above component placing part 2R of workpiece 2 which is subjected to posture adjustment by posture adjustment mechanism 15 (FIGS. 18A and 18B).

Once component P is positioned above component placing part 2R, control device 60 lowers suction nozzle 31a and places component P on component placing part 2R. In the present exemplary embodiment, since the postures of the plurality of workpieces 2 which are held in workpiece holding body 3 are collectively adjusted, the interval between the plurality of workpieces 2 which are held in workpiece holding body 3 is set to match the interval between the plurality of suction nozzles 31a, and so it is possible to collectively (or alternatively, sequentially) place components P with respect to the plurality of workpieces 2 which are held in workpiece holding body 3.

Control device 60 causes placing head 31 to reciprocate between the upper position of working conveyor 21B and part feeder 13 to place components P on all workpieces 2 which are subjected to posture adjustment by posture adjustment mechanism 15. Once components P are placed on all workpieces 2, control device 60 operates posture adjustment mechanism 15 and transport conveyor 21 in the reverse order from that in the above-described procedure, and places two workpiece holding bodies 3 on carrier 4 which is positioned at the working position. Once two workpiece holding bodies 3 are placed on carrier 4, control device 60 operates working conveyor 21B to deliver carrier 4 to carry-out conveyor 21C, and next operates carry-out conveyor 21C to carry out carrier 4 to the outside of component mounter 1. Accordingly, the component placing operation with respect to the plurality of workpieces 2 for one carrier 4 (for two workpiece holding bodies 3) is completed.

As explained above, in component mounter in the present exemplary embodiment, workpiece holding body 3 aligns and holds the plurality of workpieces in a row, and then the posture of the workpieces 2 held in the workpiece holding body 3 is adjusted due to rotation mechanism by rotating the chuck portion around an axial line which extends in an aligning direction of the plurality of workpieces held in the workpiece holding body. In the present exemplary embodiment, since the rotation shaft for adjusting the posture of workpieces 2 is one, the configuration of posture adjustment mechanism 15 becomes simple. Therefore, it is possible to collectively perform the posture adjustment of a plurality of workpieces with inexpensive configuration, and it is possible to improve productivity.

Although the exemplary embodiment of the present disclosure has been described, the present disclosure is not limited to the embodiment described above. For example, the exemplary embodiment of the present disclosure, workpiece holding body 3 aligns and holds the plurality of workpieces 2 in the transport direction (the X-axis direction) using transport conveyor 21. However, workpiece holding body 3 may align and hold the plurality of workpieces 2 in the horizontal direction (the Y-axis direction) orthogonal in a horizontal plane to the transport direction using transport conveyor 21. In this case, chuck portions 45 may be rotated around the axial line (the Y axis) which extends in the Y-axis direction (around the axial line extending in the direction where the plurality of workpieces 2 held by workpiece holding body 3 are aligned).

Two of chuck portions 45 are aligned in the Y-axis direction. However, chuck portion 45 may be one (it means that corresponding workpiece holding body 3 is one). When chuck portions 45 are aligned in the horizontal direction orthogonal to the aligning direction of the plurality of workpieces 2 held by workpiece holding body 3, chuck portions 45 may be two, three, or more.

The object of the disclosure is to provide a component mounter capable of collectively performing the posture adjustment of a plurality of workpieces with inexpensive configuration, and capable of improving productivity.

What is claimed is:

1. A component mounting method for a component mounter including: a workpiece holding body which aligns and holds a plurality of workpieces on which components are to be placed; a chuck portion which chucks the workpiece holding body; a rotation mechanism which rotates the chuck portion; and a placing head which places the components on each of the plurality of workpieces, the method comprising:

chucking the workpiece holding body at the chuck portion via a continuous drawing force:

adjusting postures of the plurality of workpieces; by rotating the chuck portion; around an axial line that extends in an aligning direction of the plurality of workpieces; and placing the components respectively on each of the plurality of workpieces.

2. The component mounting method according to claim 1, wherein the method further comprises lifting-lowering the chuck portion with a lifting-lowering mechanism, such that a component placing part at each of the plurality of workpieces subjected to posture adjustment by the rotation mechanism is positioned at a same placing height relative to one another, at which the placing head places the components.

3. The component mounting method according to claim 1, wherein the continuous drawing force chucking the workpiece holding body is provided via suction.

4. The component mounting method according to claim 1, further including applying the continuous drawing force from a plurality of openings spaced apart about an underside of the workpiece holding body.

5. The component mounting method according to claim 1, further including applying the continuous drawing force while adjusting postures and while placing the components.

6. The component mounting method according to claim 1, further including concurrently placing a component on each of the plurality of workpieces arranged at the workpiece body.

7. The component mounting method according to claim 1, further including chucking another workpiece holding body spaced apart from the workpiece holding body, and concurrently rotating both the workpiece holding body and the another workpiece holding body in a common rotation direction.

8. The component mounting method according to claim 7, further including effecting posture adjustment at each of the plurality of workpieces at the workpiece holding body and an additional plurality of workpieces at the another workpiece holding body such that the component placing part at each of the plurality of workpieces and a component placing part at each of the additional plurality of workpieces is positioned at a same placing height relative to one another, at which the placing head places the components.

\* \* \* \* \*